United States Patent
Hou et al.

(10) Patent No.: US 12,369,478 B2
(45) Date of Patent: Jul. 22, 2025

(54) DISPLAY SUBSTRATE HAVING COLOR FILTER LAYER, MANUFACTURING METHOD THEREFOR AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Peng Hou, Beijing (CN); Yongzhan Han, Beijing (CN); Guoyi Cui, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 412 days.

(21) Appl. No.: 17/771,968

(22) PCT Filed: Mar. 8, 2021

(86) PCT No.: PCT/CN2021/079546
§ 371 (c)(1),
(2) Date: Apr. 26, 2022

(87) PCT Pub. No.: WO2021/175330
PCT Pub. Date: Sep. 10, 2021

(65) Prior Publication Data
US 2022/0365618 A1 Nov. 17, 2022

(30) Foreign Application Priority Data
Mar. 6, 2020 (CN) .......................... 202010153029.9

(51) Int. Cl.
*H10K 59/38* (2023.01)
*G02F 1/1333* (2006.01)
(Continued)

(52) U.S. Cl.
CPC ......... *H10K 59/38* (2023.02); *G02F 1/13338* (2013.01); *G02F 1/133512* (2013.01);
(Continued)

(58) Field of Classification Search
CPC ....... G06F 3/0412; G06F 3/0445–0448; G06F 2203/04103; G06F 2203/04112;
(Continued)

(56) References Cited

U.S. PATENT DOCUMENTS

2004/0233352 A1* 11/2004 Chen ................. G02F 1/136209
349/106
2006/0092353 A1* 5/2006 Kim ....................... G02B 5/201
349/110
(Continued)

FOREIGN PATENT DOCUMENTS

CN 101226299 A 7/2008
CN 102681067 A 9/2012
(Continued)

OTHER PUBLICATIONS

Office Action for the Chinese Patent Application No. 202010153029.9 issued by the Chinese Patent Office on Jun. 8, 2021.

*Primary Examiner* — Keith L Crawley
(74) *Attorney, Agent, or Firm* — XSENSUS LLP

(57) ABSTRACT

A display substrate includes a substrate and a color filter layer disposed on the substrate. The color filter layer includes a plurality of filter units arranged in an array and a plurality of light-shielding units. Every two adjacent filter units are provided with a light-shielding unit of the plurality of light-shielding units therebetween. The light-shielding
(Continued)

unit includes a filter pattern of a first color and a filter pattern of a second color that are stacked in a thickness direction of the substrate, the filter pattern of the first color is closer to the substrate than the filter pattern of the second color.

19 Claims, 14 Drawing Sheets

(51) Int. Cl.
| | |
|---|---|
| *G02F 1/1335* | (2006.01) |
| *G02F 1/1343* | (2006.01) |
| *G02F 1/1362* | (2006.01) |
| *G03F 7/00* | (2006.01) |
| *G06F 3/041* | (2006.01) |
| *G06F 3/044* | (2006.01) |
| *H10K 50/86* | (2023.01) |
| *H10K 59/12* | (2023.01) |
| *H10K 59/131* | (2023.01) |
| *H10K 59/80* | (2023.01) |
| *H10K 71/00* | (2023.01) |

(52) U.S. Cl.
CPC .. *G02F 1/133516* (2013.01); *G02F 1/134309* (2013.01); *G03F 7/0007* (2013.01); *G06F 3/0412* (2013.01); *G06F 3/0446* (2019.05); *H10K 59/8792* (2023.02); *H10K 71/00* (2023.02); *G02F 1/136227* (2013.01); *G02F 2202/14* (2013.01); *G06F 2203/04103* (2013.01); *G06F 2203/04112* (2013.01); *H10K 50/865* (2023.02); *H10K 59/12* (2023.02); *H10K 59/1201* (2023.02); *H10K 59/131* (2023.02)

(58) Field of Classification Search
CPC ............... G09G 3/2003; G09G 3/3607; G09G 5/02–026; G09G 2300/0452; G09G 2300/046; H10K 50/865; H10K 59/12–1201; H10K 59/126; H10K 59/38; H10K 59/8792; H10K 71/00; G02F 1/13338; G02F 1/133509–133521; G02F 1/134309; G02F 1/136209–136227; G02F 2202/14; G03F 7/0007; G02B 5/23
See application file for complete search history.

(56) References Cited

U.S. PATENT DOCUMENTS

| | | | |
|---|---|---|---|
| 2011/0001909 A1* | 1/2011 | Tseng | G02F 1/136209 349/106 |
| 2012/0287523 A1 | 11/2012 | Wu et al. | |
| 2013/0020934 A1* | 1/2013 | Iwasaki | H10K 59/38 313/504 |
| 2013/0065168 A1* | 3/2013 | De Keyzer | G02B 5/226 430/7 |
| 2015/0318447 A1* | 11/2015 | Choi | H10K 19/10 257/98 |
| 2017/0003786 A1 | 1/2017 | Kim et al. | |
| 2018/0182814 A1* | 6/2018 | Kim | H10K 59/38 |
| 2018/0182819 A1* | 6/2018 | Jo | H10K 59/873 |
| 2018/0348931 A1* | 12/2018 | Kim | G09G 3/3225 |
| 2019/0006429 A1* | 1/2019 | Ota | H10K 59/38 |
| 2019/0206945 A1* | 7/2019 | Lin | H10K 59/8792 |
| 2020/0111856 A1* | 4/2020 | Lee | G06F 3/0446 |
| 2021/0359006 A1* | 11/2021 | Sun | H10K 59/38 |
| 2021/0366993 A1* | 11/2021 | Chen | H10K 71/00 |
| 2021/0408131 A1* | 12/2021 | Huang | H10K 59/1201 |
| 2022/0102432 A1* | 3/2022 | Xie | H10K 50/854 |

FOREIGN PATENT DOCUMENTS

| | | | | |
|---|---|---|---|---|
| CN | 102768378 A | | 11/2012 | |
| CN | 103389827 A | | 11/2013 | |
| CN | 105467663 A | * | 4/2016 | |
| CN | 110120466 A | * | 8/2019 | ....... G02F 1/133504 |
| CN | 111240078 A | | 6/2020 | |

\* cited by examiner

DISPLAY SUBSTRATE HAVING COLOR FILTER LAYER, MANUFACTURING METHOD THEREFOR AND DISPLAY APPARATUS

CROSS-REFERENCE TO RELATED APPLICATIONS

This application is a national phase entry under 35 USC 371 of International Patent Application No. PCT/CN2021/079546 filed on Mar. 8, 2021, which claims priority to Chinese Patent Application No. 202010153029.9, filed on Mar. 6, 2020, which are incorporated herein by reference in their entirety.

TECHNICAL FIELD

The present disclosure relates to the field of display technologies, and in particular, to a display substrate and a manufacturing method therefor, and a display apparatus.

BACKGROUND

With the development of display technologies, display apparatuses with a flexible metal layer on cell (FMLOC) structure are gradually entering the market. Integrating touch technologies into the display apparatuses is one of the mainstream directions of the multifunction development of the display apparatuses at present, which is helpful to achieve comprehensive flexibility and further increase functional advantages of the display apparatuses.

SUMMARY

In one aspect, a display substrate is provided. The display substrate includes a substrate and a color filter layer disposed on the substrate. The color filter layer includes a plurality of filter units arranged in an array and a plurality of light-shielding units. Every two adjacent filter units are provided with a light-shielding unit of the plurality of light-shielding units therebetween. The light-shielding unit includes a filter pattern of a first color and a filter pattern of a second color that are stacked in a thickness direction of the substrate, and the filter pattern of the first color is closer to the substrate than the filter pattern of the second color.

In some embodiments, at least one filter unit includes another filter pattern; or at least one filter unit includes another filter pattern and a transparent pattern that are stacked in the thickness direction of the substrate; or at least one filter unit includes another two filter patterns of a same color that are stacked in the thickness direction of the substrate.

In some embodiments, the plurality of filter units include first filter nits, second filter units and third filter units that are different in color. A first filter unit includes another filter pattern of the first color. A second filter unit includes a transparent pattern and another filter pattern of the second color that are stacked in a direction that is in the thickness direction of the substrate and away from the substrate. A third filter unit includes another transparent pattern and a filter pattern of a third color that are stacked in a direction that is in the thickness direction of the substrate and away from the substrate.

In some embodiments, a thickness of the filter pattern of the first color included by the first filter unit is greater than a thickness of the filter pattern of the first color included by the light-shielding unit.

In some embodiments, a thickness of the transparent pattern included by the second filter unit and a thickness of the transparent pattern included by the third filter unit are both equal to a thickness of the filter pattern of the first color included by the light-shielding unit.

In some embodiments, the filter pattern of the first color included by the light-shielding unit, the filter pattern of the first color included by the first filter unit, the transparent pattern included by the second filter unit and the transparent pattern included by the third filter unit are provided as a one-piece structure; and/or the filter pattern of the second color included by the light-shielding unit and yet another filter pattern of the second color included by a second filter unit adjacent to the light-shielding unit are provided as a one-piece structure.

In some embodiments, the plurality of filter units each include another filter pattern and one transparent pattern that are stacked in the thickness direction of the substrate, and the transparent pattern is closer to the substrate than the another filter pattern.

In some embodiments, the plurality of filter units include first filter units, second filter units and third filter units that are different in color. Another filter pattern included by a first filter unit is another filter pattern of the first color. Another filter pattern included by a second filter unit is another filter pattern of the second color. Another filter pattern included by a third filter unit is a filter pattern of a third color.

In some embodiments, the filter pattern of the second color included by the light-shielding unit and yet another filter pattern of the second color included by a second filter unit adjacent to the light-shielding unit are provided as a one-piece structure.

In some embodiments, thicknesses of transparent patterns included by the plurality of filter units are all equal to a thickness of the filter pattern of the first color included by the light-shielding unit.

In some embodiments, the plurality of filter units include first filter units, second filter units and third filter units that are different in color. A second filter unit includes a transparent pattern and another filter pattern of the second color that are stacked in the thickness direction of the substrate. A third filter unit includes another transparent pattern and a filter pattern of a third color that are stacked in the thickness direction of the substrate. A first filter unit includes another filter pattern of the first color or includes yet another transparent pattern and another filter pattern of the first color that are stacked in the thickness direction of the substrate. A material of the transparent patterns is a photochromic material. A material of the filter patterns of the first color included by the first filter unit and the light-shielding unit is the photochromic material after being irradiated by set light. The photochromic material is in a transparent and colorless state in a case of not being irradiated by the set light, and is in the first color after being irradiated by the set light.

In some embodiments, the photochromic material includes a photochromic compound, a photosensitizer and a resin.

In some embodiments, the filter pattern of the first color is a red filter pattern, and the filter pattern of the second color is a blue filter pattern; or the filter pattern of the first color is a blue filter pattern, and the filter pattern of the second color is a red filter pattern.

In some embodiments, a thickness of a filter unit of the plurality of filter units is greater than a thickness of the filter pattern of the first color, and is less than a sum of the thickness of the filter pattern of the first color and twice a thickness of the filter pattern of the second color.

In some embodiments, the thickness of the filter unit is equal to a thickness of the light-shielding unit.

In some embodiments, a surface of the filter unit away from the substrate is flush with a surface of the light-shielding unit away from the substrate.

In some embodiments, a surface of at least one filter unit away from the substrate has a microstructure.

In some embodiments, the display substrate further includes a touch layer disposed on a side of the color filter layer away from the substrate. The touch layer includes a plurality of first touch electrodes and a plurality of second touch electrodes that are arranged crosswise. Orthographic projections of the plurality of first touch electrodes and the plurality of second touch electrodes on the substrate are within a range of orthographic projections of the plurality of light-shielding units on the substrate.

In some embodiments, a first touch electrode and a second touch electrode are each of a metal grid structure.

In another aspect, a display apparatus is provided. The display apparatus includes the display substrate as described in any one of the above embodiments.

In yet another aspect, a manufacturing method of a display substrate is provided. The method includes: forming a color filter layer on a substrate. The color filter layer includes a plurality of filter units arranged in an array and a plurality of light-shielding units. Every two adjacent filter units are provided with a light-shielding unit of the plurality of light-shielding units therebetween. The light-shielding unit includes a filter pattern of a first color and a filter pattern of a second color that are stacked in a thickness direction of the substrate, and the filter pattern of the first color is closer to the substrate than the filter pattern of the second color.

In some embodiments, the plurality of filter units include first filter units, second filter units and third filter units that are different in color. Forming the color filter layer on the substrate includes: forming a first transparent film made of a photochromic material on the substrate, the photochromic material being in a transparent and colorless state in a case of not being irradiated by set light, and being in the first color after being irradiated by the set light; patterning the first transparent film to form a first transparent layer, the first transparent layer including a first pattern and a second pattern, a thickness of the first pattern being greater than a thickness of the second pattern, the first pattern being formed in a region where a first filter unit is to be formed, and the second pattern being formed in a region where a second filter unit, a third filter unit and the light-shielding unit are to be formed; performing mask exposure on the first transparent layer by using of the set light, so that a color of the first pattern is changed into the first color to form the first filter unit, a color of a portion of the second pattern corresponding to the light-shielding unit to be formed is changed into the first color to form the filter pattern of the first color, and a color of portions of the second pattern corresponding to the second filter unit to be formed and the third filter unit to be formed are maintained in the transparent and colorless state to form transparent patterns; forming the filter patterns of the second color on the filter pattern of the first color corresponding to the light-shielding unit to be formed and on the transparent pattern corresponding to the second filter unit to be formed, so as to form the light-shielding unit and the second filter unit; and forming a filter pattern of a third color on the transparent pattern corresponding to the third filter unit to be formed, so as to form the third filter unit.

In some embodiments, the plurality of filter units include first filter units, second filter units and third filter units that are different in color. Forming the color filter layer on the substrate includes: forming a second transparent layer on the substrate, the second transparent layer including a plurality of transparent patterns and a plurality of hollowed-out portions, every two adjacent transparent patterns being provided with a hollowed-out portion of the plurality of hollowed-out portions therebetween; forming the filter pattern of the first color in the hollowed-out portion; forming another filter pattern of the first color on a transparent pattern in a region where a first filter unit is to be formed, so as to form the first filter unit; forming the filter pattern of the second color on the filter pattern of the first color formed in the hollowed-out portion, so as to form the light-shielding unit; forming another filter pattern of the second color on a transparent pattern in a region where a second filter unit is to be formed, so as to form the second filter unit; and forming a filter pattern of a third color on a transparent pattern in a region where the third filter unit is to be formed, so as to form the third filter unit.

In some embodiments, the method further includes forming a touch layer on the color filter layer. The touch layer includes a plurality of first touch electrodes and a plurality of second touch electrodes that are arranged crosswise. Orthographic projections of the plurality of first touch electrodes and the plurality of second touch electrodes on the substrate are within orthographic projections of the plurality of light-shielding units on the substrate.

In some embodiments, forming the touch layer on the color filter layer includes: forming a first metal film on a surface of the plurality of the light-shielding units; performing resist coating, mask exposure, development and etching processes on the first metal film in sequence, so as to form a first metal layer and a photoresist pattern layer covering the first metal layer; bombarding surfaces, away from the substrate, of the plurality of filter units with plasma to make the surfaces of the plurality of filter units each have a microstructure; removing the photoresist pattern layer; forming an insulating layer having a plurality of via holes on the first metal layer; forming a second metal film on the insulating layer; and patterning the second metal film to form a second metal layer, the second metal layer being electrically connected to the first metal layer through the plurality of via holes. One of the first metal layer and the second metal layer includes a plurality of rows of first sub-electrodes and a plurality of columns of second sub-electrodes, first sub-electrodes in each row are connected in series to form a first touch electrode; and another of the first metal layer and the second metal layer includes a plurality of connection portions, every two adjacent second sub-electrodes in each column of second sub-electrodes are electrically connected to a connection portion through via holes to form a second touch electrode.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
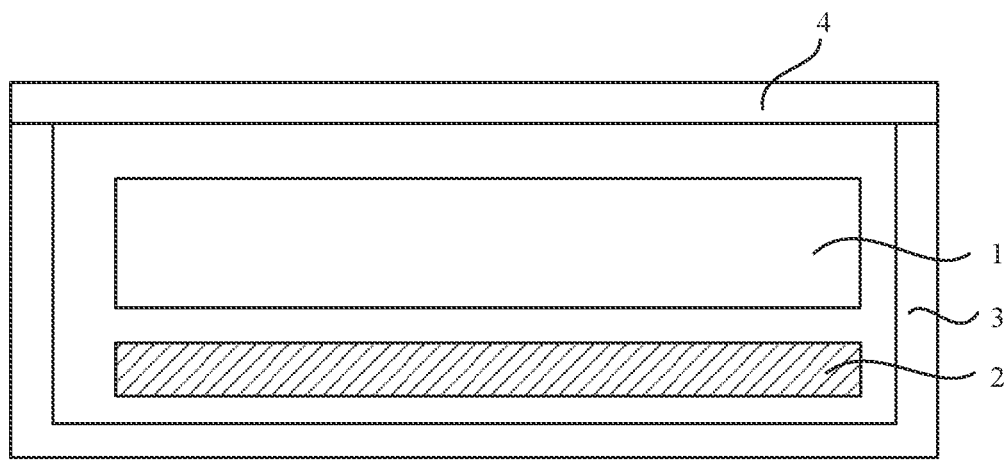
FIG. 1 is a structural diagram of a display apparatus, in accordance with some embodiments.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" and "some examples" are intended to indicate that specific features, structures or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined by the terms such as "first" and "second" may explicitly or implicitly include one or more of the features. In the description of the embodiments of the present disclosure, the term "a plurality of/the plurality of" means two or more unless otherwise specified.

In the description of some embodiments of the present disclosure, orientations or positional relationships indicated by the terms such as "center", "upper", "lower", "front", "behind", "left", "right", "vertical", "horizontal", "top", "bottom" "inner", "outer" and the like are based on the orientations or positional relationships shown in the drawings. They are used merely for convenience in describing the present disclosure and simplifying the description, but not to indicate or imply that the indicated apparatus or element must have a specific orientation, or be constructed and operated in a specific orientation, and thus they cannot be construed as a limitation of the present disclosure.

In the description of some embodiments, terms such as "coupled" and "connected" and their extensions may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. The term "coupled" or "communicatively coupled", however, may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of "applicable to" or "configured to" herein means an open and inclusive expression, which does not exclude devices that are applicable to or configured to perform additional tasks or steps.

As used herein, the term such as "about", "substantially" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Some embodiments of the present disclosure provide a display apparatus, and the display apparatus may be a liquid crystal display (LCD) apparatus, or an electroluminescent display apparatus. In a case where the display apparatus is the electroluminescent display apparatus, the electroluminescent display apparatus may be an organic light-emitting diode (OLED) display apparatus or a quantum dot light-emitting diode (QLED) display apparatus.

In addition, the display apparatus provided in some embodiments of the present disclosure may be a product or component having any display function, such as a television, a digital camera, a cell phone, a tablet computer, etc.

As shown in FIG. 1, the display apparatus mainly includes a display panel 1, a circuit board 2, a frame 3, a cover plate 4 and other accessories. In a case where the display apparatus is the liquid crystal display apparatus, the display apparatus further includes a backlight module. Herein, the display panel 1 may be a flexible display panel, or a rigid display panel. In a case where the display panel 1 is the flexible display panel, the display apparatus is a flexible display apparatus.

A longitudinal section of the frame 3 is U-shaped. The display panel 1, the circuit board 2 and the other accessories are all disposed within the frame 3, the circuit board 2 is disposed below the display panel 1 (i.e., behind the display panel 1, at a side facing away from a display surface of the display panel 1), and the cover plate 4 is disposed at a side of the display panel 1 away from the circuit board 2. In a case where the display apparatus is the liquid crystal display apparatus and the liquid crystal display apparatus includes the backlight module, the backlight module may be disposed between the display panel 1 and the circuit board 2.

Figure 2:
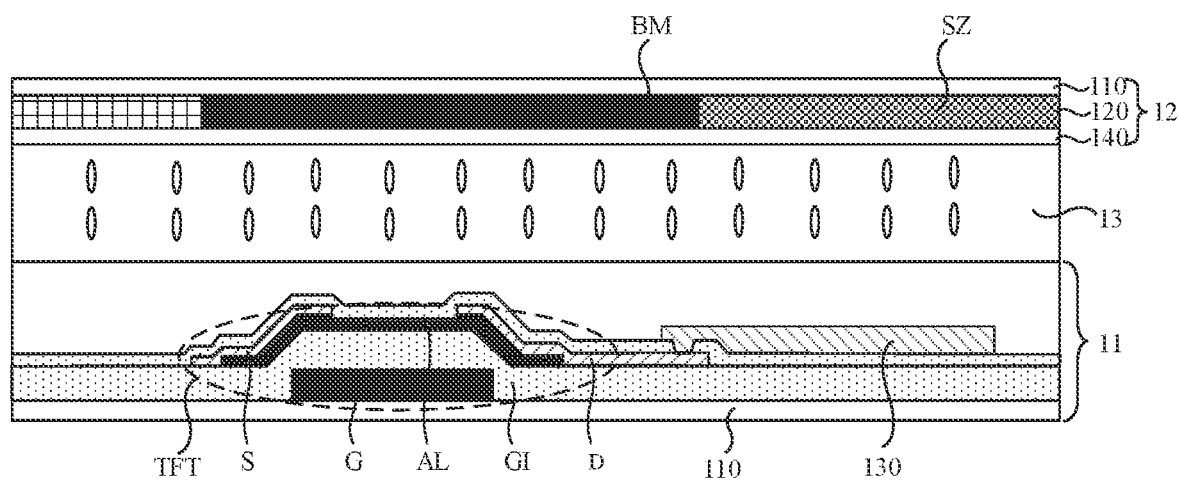
FIG. 2 is a structural diagram of a liquid crystal display panel, in accordance with some embodiments.

In the case where the display apparatus is the liquid crystal display apparatus, the display panel 1 is a liquid crystal display panel. As shown in FIG. 2, the display panel 1 includes an array substrate 11, an opposite substrate 12, and a liquid crystal layer 13 disposed between the array substrate 11 and the opposite substrate 12.

Figure 3:
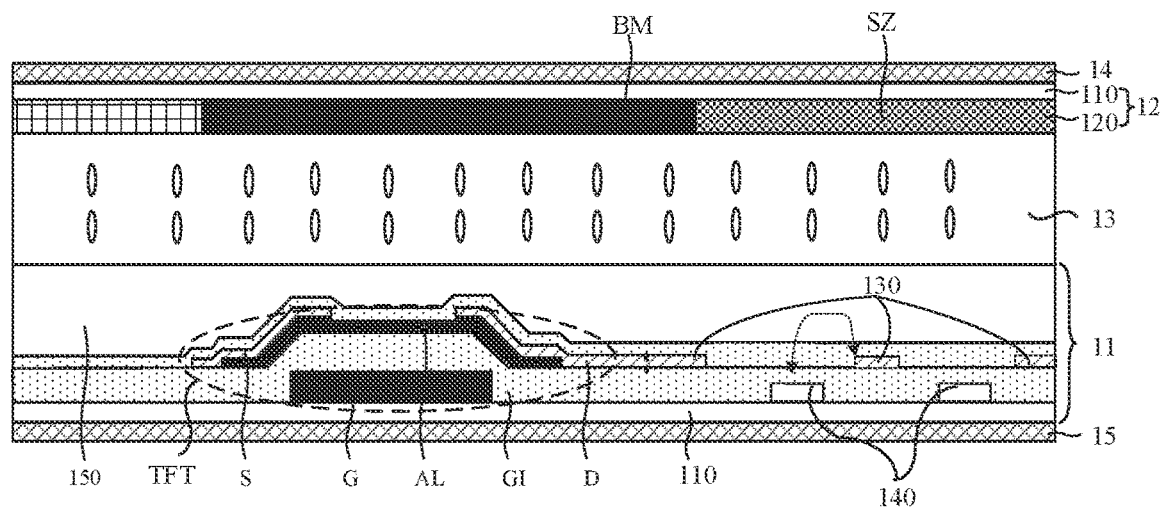
FIG. 3 is a structural diagram of another liquid crystal display panel, in accordance with some embodiments.
Figure 4:
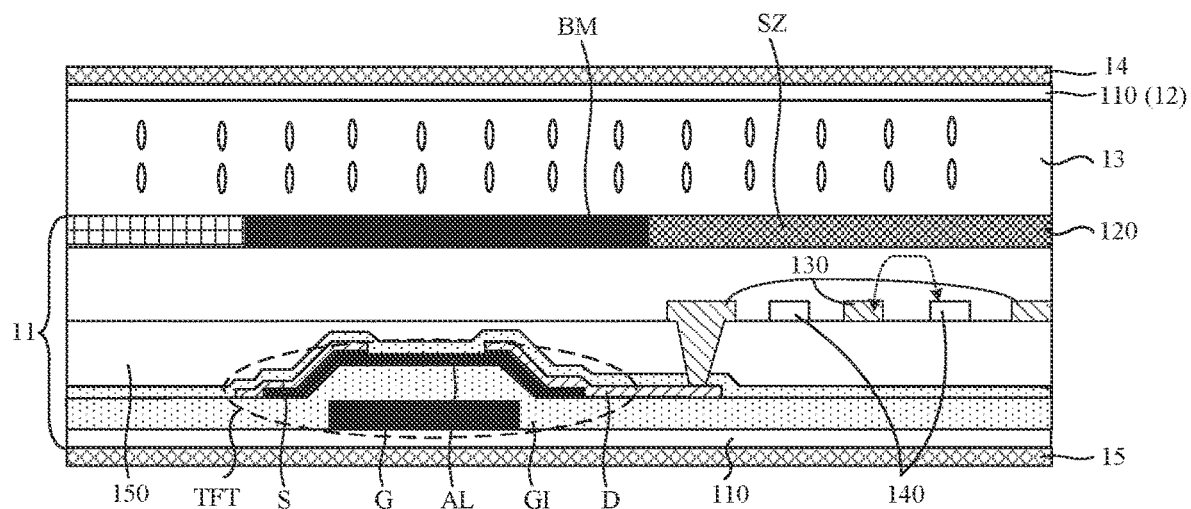
FIG. 4 is a structural diagram of yet another liquid crystal display panel, in accordance with some embodiments.

In some embodiments, as shown in FIGS. 3 and 4, the display panel 1 further includes an upper polarizer 14 disposed on a side of the opposite substrate 12 away from the liquid crystal layer 13, and a lower polarizer 15 disposed on a side of the array substrate 11 away from the liquid crystal layer 13.

As shown in FIG. 2, for example, the array substrate 11 includes a substrate 110, and a plurality of pixel circuits and a plurality of pixel electrodes 130 that are disposed on the substrate 110.

The array substrate 11 further includes a plurality of gate lines extending in a certain direction (e.g., a direction of a row of sub-pixels) and a plurality of data lines insulated from and crossing the gate lines, which are on the substrate 110. The plurality of gate lines and the plurality of data lines are arranged crosswise to define a plurality of sub-pixels. Each sub-pixel has a pixel circuit and a pixel electrode 130, and the pixel circuit is electrically connected to the pixel electrode 130.

The pixel circuit includes at least one thin film transistor TFT, and the thin film transistor TFT may have a top-gate structure or a bottom-gate structure. In a case where the thin film transistor TFT has the top-gate structure, the thin film transistor TFT includes an active layer AL, a portion of a gate insulating layer GI, a gate electrode G, a portion of an interlayer dielectric layer ILD, and source and drain electrodes (including a source electrode S and a drain electrode D), which are sequentially stacked. In a case where the thin film transistor TFT has the bottom-gate structure, the thin film transistor TFT includes a gate electrode G, a portion of a gate insulating layer GI, an active layer AL, and source and drain electrodes (including a source electrode S and a drain electrode D), which are sequentially stacked.

The active layer AL of the thin film transistor TFT may be composed of amorphous silicon, monocrystalline silicon, polycrystalline silicon or oxide semiconductor. The active layer AL includes a channel region that is not doped with any impurity, and a source region and a drain region that are formed by doping impurities on both sides of the channel region. The doped impurities vary with the type of the thin film transistor, and may be N-type impurities or P-type impurities.

The gate electrode G of the thin film transistor TFT is connected to a gate line, the source electrode S of the thin film transistor TFT is connected to a data line, and the drain electrode D of the thin film transistor TFT is connected to a pixel electrode 130 through a via hole. The thin film transistor TFT is turned on by a gate voltage applied to the gate line, so that a data voltage applied to the data line is transmitted to the pixel electrode 130, thereby completing data writing of a sub-pixel.

With continued reference to FIG. 2, for example, the opposite substrate 12 includes another substrate 110, and a color filter layer 120 and a common electrode 140 that are sequentially stacked on a side of the substrate 110 proximate to the liquid crystal layer 13. The color filter layer 120 includes a plurality of color resistors SZ arranged in an array and a black matrix BM, and every two adjacent color resistors SZ are provided with a portion of the black matrix BM therebetween. The plurality of color resistors SZ at least include red photoresist units, green photoresist units and blue photoresist units. The red photoresist units, the green photoresists unit and the blue photoresist units respectively correspond to different sub-pixels in a one-to-one manner. The black matrix BM is used to space the red photoresist units, the green photoresist units and the blue photoresist units apart, so as to avoid mutual interference of light emitted from adjacent sub-pixel regions. The common electrode 140 may be a planar electrode.

In some embodiments, as shown in FIG. 3, a common electrode 140 is disposed in the array substrate 11, that is, the array substrate 11 includes the common electrode 140 disposed on the substrate 110 in addition to the structures mentioned above. In this case, the pixel electrode 130 and the common electrode 140 each have a comb-tooth structure including a plurality of strip-shaped sub-electrodes, the strip-shaped sub-electrodes of the pixel electrode 130 and the strip-shaped sub-electrodes of the common electrode 140 are arranged at intervals. The pixel electrode 130 and the common electrode 140 may be disposed in a same layer, or may be disposed in different layers. On this basis, the opposite substrate 12 includes another substrate 110 and a color filter layer 120 disposed on a side of the substrate 110 proximate to the liquid crystal layer 13. A structure of the color filter layer 120 has been described above and will not be described in detail herein.

In some other embodiments, as shown in FIG. 4, a color filter layer 120 is disposed in the array substrate 11, that is, the array substrate 11 includes the color filter layer 120 disposed on a side of the pixel electrode 130 away from the substrate 110 in addition to the structures mentioned above and a common electrode 140. The structure of the color filter layer 120 has been described above and will not be described in detail herein. In this case, the array substrate 11 is referred to as a color filter on array (COA) substrate.

As shown in FIGS. 2 to 4, the array substrate 11 further includes a planarization layer 150 disposed on the side of the pixel electrode 130 away from the substrate 110.

Figure 5:
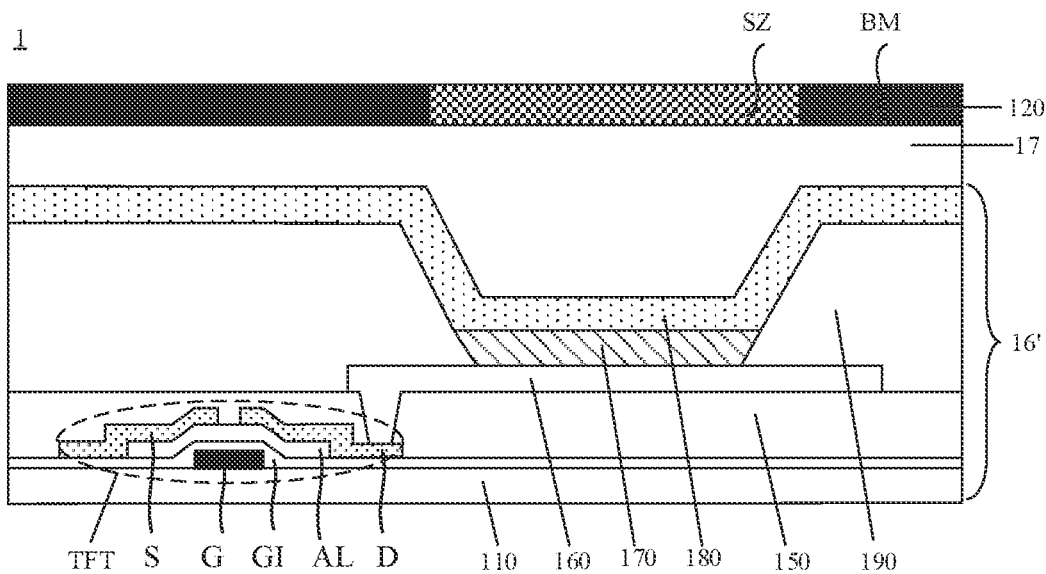
FIG. 5 is a structural diagram of an electroluminescent display panel, in accordance with some embodiments.

In the case where the display apparatus is the electroluminescent display apparatus, the display panel 1 is an electroluminescent display panel. As shown in FIG. 5, the display panel 1 includes a display substrate 16' and an encapsulation layer 17 for encapsulating the display substrate 16. The encapsulation layer 17 may be encapsulation film(s) or an encapsulation substrate.

In a case where the encapsulation layer 17 is the encapsulation film(s), the number of layers of the encapsulation film(s) included in the encapsulation layer 17 is not limited. In some embodiments, the encapsulation layer 17 may include one layer of encapsulation film, or two or more layers of encapsulation films that are stacked. For example, the encapsulation layer 17 includes three layers of encapsulation films that are sequentially stacked.

For example, in a case where the encapsulation layer 17 includes the three layers of encapsulation films that are sequentially stacked, a material of an encapsulation film located in an intermediate layer is an organic material, and a material of encapsulation films located on both sides is an inorganic material.

Herein, the organic material is not limited and may be, for example, polymethyl methacrylate (PMMA). Similarly, the inorganic material is not limited and may be, for example, one or more of silicon nitride ($SiN_x$), silicon oxide ($SiO_x$) or silicon oxynitride ($SiO_xN_y$).

As shown in FIG. 5, the display substrate 16' includes another substrate 110, and a plurality of pixel circuits and a plurality of light-emitting devices that are disposed on the substrate 110. The display substrate 16' includes a plurality of sub-pixels. Each sub-pixel includes a pixel circuit and a light-emitting device, and the pixel circuit is electrically connected to the light-emitting device for driving the light-emitting device to emit light.

The display substrate 16' further includes gate lines extending in a certain direction on the substrate 110, data lines and common power lines both insulated from and crossing the gate lines, and the common power lines may be parallel to the data lines.

The pixel circuit includes a plurality of thin film transistors TFT and at least one capacitor.

A structure of the thin film transistor TFT has been described above and will not be described in detail herein. The capacitor includes a first electrode plate and a second electrode plate, between which an interlayer insulating film as a dielectric is provided.

A 2T1C structure in which the pixel circuit includes two thin film transistors TFT (i.e., a switching thin film transistor and a driving thin film transistor) and one capacitor is taken as an example to describe electrical connection relationships inside and outside the pixel circuit. FIG. 5 only shows structures of the driving thin film transistor (a structure as shown in a dashed ellipse in FIG. 5) and the light-emitting device, and a connection relationship therebetween.

A gate electrode of the switching thin film transistor is connected to a gate line, a source electrode of the switching thin film transistor is connected to a data line, and a drain electrode of the switching thin film transistor is connected to a gate electrode of the driving thin film transistor. A source electrode S of the driving thin film transistor is connected to a common power line, and a drain electrode D of the driving thin film transistor is connected to an anode 160 of the light-emitting device through a via hole. The first electrode plate of the capacitor is connected to the gate electrode G of the driving thin film transistor, and the second electrode plate of the capacitor is connected to the source electrode S of the driving thin film transistor.

The switching thin film transistor is turned on by a gate voltage applied to the gate line, thereby transmitting a data voltage applied to the data line to the driving thin film transistor. There is a certain difference between the data voltage transmitted from the switching thin film transistor to the driving thin film transistor and a common voltage applied from the common power line to the driving thin film transistor. A voltage equivalent to an absolute value of the difference is stored in the capacitor, and a current corresponding to the voltage stored in the capacitor flows into the light-emitting device through the driving thin film transistor, so that the light-emitting device emits light.

The light-emitting device includes the anode 160, a light-emitting functional layer 170 and a cathode 180. The anode 160 and the cathode 180 respectively inject holes and electrons into the light-emitting functional layer 170, and the light-emitting functional layer 170 emits light when excitons generated by the combination of the holes and the electrons transition from an excited state to a ground state.

The anode 160 may be formed of a metal with high reflectivity, and the cathode 180 may be formed of a transparent conductive film. In this case, light from the light-emitting functional layer 170 is reflected by the anode 160 and is emitted to the outside through the cathode 180, thereby forming a top-emission light-emitting device. However, the present disclosure is not limited thereto. In a case where the anode 160 is formed of a transparent conductive film, and the cathode 180 is formed of a metal with high reflectivity, a bottom-emission light-emitting device may be formed. Of course, in a case where the anode 160 and the cathode 180 are both formed of a transparent conductive film, a double-sided-emission light-emitting device may be formed.

A material of the transparent conductive film may be indium tin oxide (ITO), indium zinc oxide (IZO) or indium gallium zinc oxide (IGZO). The metal with high reflectivity may be, for example, silver (Ag).

In some embodiments, the light-emitting functional layer 170 includes a light-emitting layer. In some other embodiments, the light-emitting functional layer 170 includes one or more of an electron transport layer (ETL), an electron injection layer (EIL), a hole transport layer (HTL) and a hole injection layer (HIL) in addition to a light-emitting layer.

As shown in FIG. 5, the display substrate 16' further includes a planarization layer 150 disposed between the thin film transistor TFT and the anode 160, and a pixel defining layer 190 disposed on a side of the anode 160 away from the substrate 110. The pixel defining layer 190 includes a plurality of opening regions and a barrier wall disposed around the opening regions. A light-emitting layer of a light-emitting device is disposed in an opening region, anodes 160 of adjacent light-emitting devices are separated by the barrier wall of the pixel defining layer 190, and light-emitting layers of the adjacent light-emitting devices are separated by the barrier wall of the pixel defining layer 190. Cathodes 180 of all light-emitting devices are connected as a whole, that is, the cathodes 180 are a whole layer.

In a case where the light-emitting device includes one or more of the electron transport layer, the electron injection layer, the hole transport layer and the hole injection layer, layers, of a same type (electron transport layers, electron injection layers, hole transport layers or hole injection layers), of all light-emitting devices may be connected as a whole, that is, these layers are a whole layer; alternatively, layers, of a same type (electron transport layers, electron injection layers, hole transport layers or hole injection layers), of all light-emitting devices may be unconnected, that is, these layers are only disposed in the opening regions.

As shown in FIG. 5, the display substrate 16' further includes a color filter layer 120 disposed on the encapsulation layer 17. The structure of the color filter layer 120 has been described above and will not be described in detail herein. In this case, the display substrate 16' is referred to as a color filter on encapsulation (COE) substrate.

Figure 6:
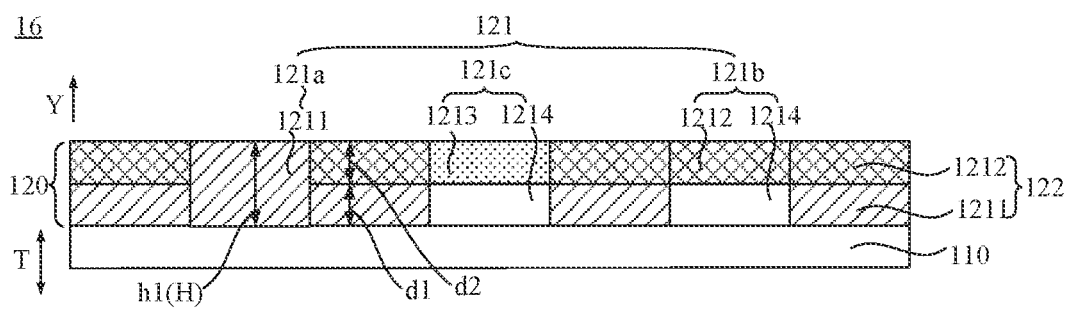
FIG. 6 is a sectional diagram of a display substrate, in accordance with some embodiments.

To simplify a process of manufacturing the display substrate, some embodiments of the present disclosure provide a display substrate 16, which is used in the display apparatus mentioned above. As shown in FIG. 6, the display substrate 16 includes a substrate 110 and a color filter (CF) layer 120 disposed on the substrate 110. The color filter layer 120 includes a plurality of filter units 121 arranged in an array and a light-shielding unit 122 disposed between every two adjacent filter units 121. The light-shielding unit 122 includes a filter pattern 1211 of a first color and a filter pattern 1212 of a second color that are stacked in a thickness direction T of the substrate 110, and the filter pattern 1211 of the first color is closer to the substrate 110 than the filter pattern 1212 of the second color.

The first color and the second color are not limited. For example, the first color is red and the second color is blue; alternatively, the first color is blue and the second color is red. In this case, the light-shielding unit 122 includes a red filter pattern and a blue filter pattern that are stacked. For another example, the first color is red and the second color is green; alternatively, the first color is green and the second color is red. In this case, the light-shielding unit 122 includes a red filter pattern and a green filter pattern that are stacked. For yet another example, the first color is blue and the second color is green; alternatively, the first color is green and the second color is blue. In this case, the light-shielding unit 122 includes a blue filter pattern and a green filter pattern that are stacked. It will be understood that in some embodiments of the present disclosure, the first color and the second color include, but are not limited to, red, blue and green, and any other color is within the protection scope of some embodiments of the present disclosure and will not be described in detail herein.

In some embodiments of the present disclosure, FIG. 6 is illustrated by taking an example in which the first color is red and the second color is blue. It will be understood that there further exists a filter pattern of a third color, and in a case where the first color is red and the second color is blue, the third color is green.

The light-shielding unit 122 in the display substrate 16 provided in some embodiments of the present disclosure includes the filter pattern 1211 of the first color and the filter pattern 1212 of the second color that are stacked in the thickness direction T of the substrate 110, and the filter pattern 1211 of the first color is closer to the substrate 110 than the filter pattern 1212 of the second color. The filter pattern 1211 of the first color and the filter pattern 1212 of the second color that are stacked are used to replace the black matrix, thereby reducing a process of separately manufacturing the black matrix, and further simplifying a process of manufacturing the display substrate 16.

Figure 8A:
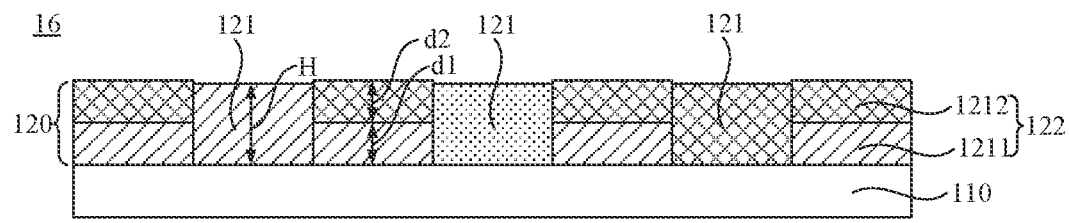
FIG. 8A is a sectional diagram of yet another display substrate, in accordance with some embodiments.
Figure 8B:
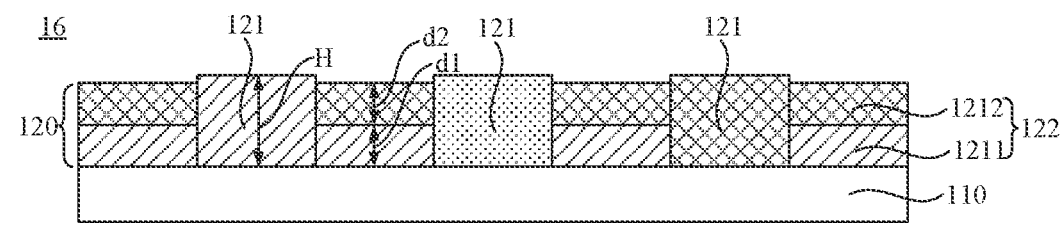
FIG. 8B is a sectional diagram of yet another display substrate, in accordance with some embodiments.

In some embodiments, as shown in FIGS. 6, 8A and 8B, a thickness of the filter unit 121 is H, a thickness of the filter pattern 1211 of the first color included by the light-shielding unit 122 is d1, and a thickness of the filter pattern 1212 of the second color included by the light-shielding unit 122 is d2. The thickness H of the filter unit 121 is greater than the thickness d1 of the filter pattern 1211 of the first color, and is less than a sum of the thickness d1 of the filter pattern 1211 of the first color and twice the thickness d2 of the filter pattern 1212 of the second color, i.e., $d1 < H < d1 + 2 \times d2$. In this way, a difference between the thicknesses of the light-shielding unit 122 and the filter unit 121 that are in the color filter layer 120 is relatively small, that is, a thickness of the color filter layer 120 is relatively uniform, so that the color filter layer 120 is relatively flat.

For example, as shown in FIG. 8A, the thickness H of the filter unit 121 is greater than the thickness d1 of the filter pattern 1211 of the first color, and is less than a sum of the thickness d1 of the filter pattern 1211 of the first color and the thickness d2 of the filter pattern 1212 of the second color, i.e., $d1 < H < d1 + d2$.

For example, as shown in FIG. 8B, the thickness H of the filter unit 121 is greater than the sum of the thickness d1 of the filter pattern 1211 of the first color and the thickness d2 of the filter pattern 1212 of the second color, and is less than the sum of the thickness d1 of the filter pattern 1211 of the first color and the thicknesses d2 of two filter patterns 1212 of the second color, i.e., $d1 + d2 < H < d1 + 2 \times d2$.

Figure 8C:
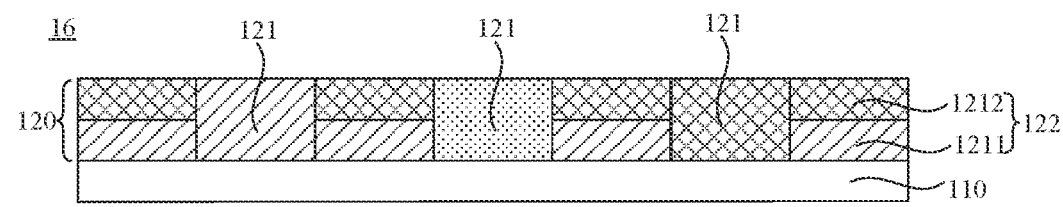
FIG. 8C is a sectional diagram of yet another display substrate, in accordance with some embodiments.

In some embodiments, as shown in FIG. 8C, the thickness of the filter unit 121 is approximately equal to a thickness of the light-shielding unit 122. In this way, flatness of a surface of the color filter layer 120 may be further improved.

In some embodiments, since the thickness of the filter unit 121 is approximately equal to the thickness of the light-shielding unit 122, that is, a surface of the filter unit 121 away from the substrate 110 is flush with a surface of the light-shielding unit 122 away from the substrate 110, the surface of the color filter layer 120 may be further flat.

In some embodiments, for a same filter unit 121, the filter unit 121 may include one filter pattern, or may include one filter pattern and one transparent pattern that are stacked in the thickness direction of the substrate 110, or may include two filter patterns of a same color that are stacked in the thickness direction of the substrate 110.

In some embodiments of the present disclosure, materials of the two filter patterns of the same color that are stacked may be the same or different.

In some embodiments, among the plurality of filter units 121, at least one filter unit 121 includes one filter pattern. The number of the filter unit(s) 121 including the one filter pattern is not limited in the present disclosure, which may be one, two or more than two. FIG. 6 shows that one filter unit 121 includes one filter pattern 1211, and FIG. 8A shows that three filter units 121 each include one filter pattern.

Figure 7:
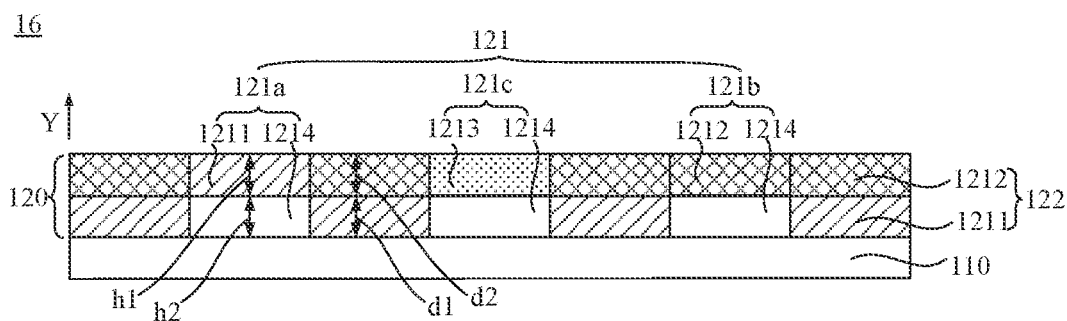
FIG. 7 is a sectional diagram of another display substrate, in accordance with some embodiments.

In some other embodiments, among the plurality of filter units 121, at least one filter unit 121 includes one filter pattern and one transparent pattern that are stacked in the thickness direction of the substrate 110. The number of the filter unit(s) 121 including the one filter pattern and the one transparent pattern is not limited in the present disclosure, which may be one, two or more than two. FIG. 6 shows that two filter units 121 each include one filter pattern (represented by 1212 or 1213) and one transparent pattern 1214, and FIG. 7 shows that three filter units 121 each include one filter pattern (represented by 1211, 1212 or 1213) and one transparent pattern 1214. For example, for a filter unit 121 including one filter pattern and one transparent pattern, the transparent pattern may be closer to the substrate 110 than the filter pattern, that is, the transparent pattern and the filter pattern are stacked in a direction that is in the thickness direction of the substrate 110 and away from the substrate 110.

Figure 9:
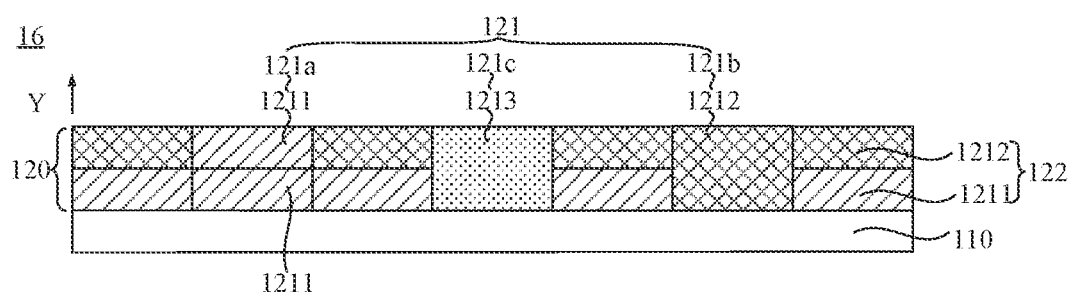
FIG. 9 is a sectional diagram of yet another display substrate, in accordance with some embodiments.
Figure 10:
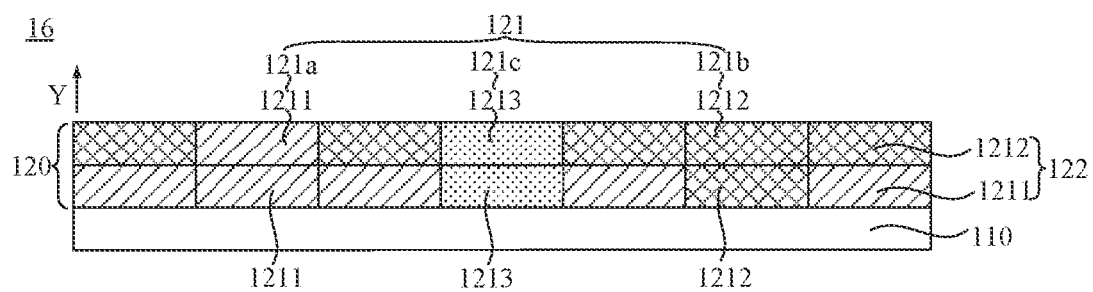
FIG. 10 is a sectional diagram of yet another display substrate, in accordance with some embodiments.

In yet some other embodiments, among the plurality of filter units 121, at least one filter unit 121 includes two filter patterns of a same color that are stacked in the thickness direction of the substrate 110. The number of the filter units) 121 including the two filter patterns of the same color is not limited in the present disclosure, which may be one, two or more than two. FIG. 9 shows that one filter unit 121 includes two filter patterns 1211 of a same color, and FIG. 10 shows that three filter units 121 each include two filter patterns of a same color (represented by 1211, 1212 or 1213).

It will be understood that the plurality of filter units 121 include first filter units 121*a*, second filter units 121*b* and third filter units 121*c* that are different n color. Colors of the first filter units 121*a*, the second filter units 121*b* and the third filter units 121*c* are not limited. As shown in FIG. 6, a color of a first filter unit 121*a* is red (that is, the first filter unit 121*a* is a red filter unit), a color of a second filter unit 121*b* is blue (that is, the second filter unit 121*b* is a blue filter unit), and a color of a third filter unit 121*c* is green (that is, the third filter unit 121*c* is a green filter unit).

The first filter unit 121*a* is taken as an example, and an arrangement of the first filter unit 121*a* includes but is not limited to the following three types.

In a first type, as shown in FIG. 6, the first filter unit 121*a* includes one filter pattern 1211 of the first color.

In a second type, as shown in FIG. 7, the first filter unit 121*a* includes one transparent pattern 1214 and one filter pattern 1211 of the first color that are stacked in a direction Y that is in the thickness direction of the substrate 110 and away from the substrate 110.

In a third type, as shown in FIG. 9, the first filter unit 121*a* includes two filter patterns 1211 of the first color that are stacked in the direction Y that is in the thickness direction of the substrate 110 and away from the substrate 110.

Based on the above, it will be seen that a single filter unit 121 of a color has three arrangements, and thus, in a case where the plurality of filter units 121 includes filter units 121 of three colors (e.g., the red filter units, the blue filter units and the green filter units), there will exist 27 (i.e., 3×3×3) arrangements.

In some embodiments, arrangements for filter units 121 of different colors may be the same or different.

For example, as shown in FIG. 6, the first filter unit 121*a* includes one filter pattern 1211 of the first color, and the second filter unit 121*b* includes one transparent pattern 1214 and one filter pattern 1212 of the second color. That is, the first filter unit 121*a* includes one filter pattern, and second filter unit 121*b* includes one transparent pattern and one filter pattern.

As shown in FIG. 7, the first filter unit 121*a* includes one transparent pattern 1214 and one filter pattern 1211 of the first color, and the second filter unit 121*b* includes one transparent pattern 1214 and one filter pattern 1212 of the second color. That is, the first filter unit 121*a* and the second filter unit 121*b* each include one transparent pattern and one filter pattern.

In some embodiments, arrangements for filter units 121 of a same color are the same. For example, a plurality of first filter units 121*a* each include one filter pattern 1211 of the first color, a plurality of second filter units 121*b* each include one transparent pattern 1214 and one filter pattern 1212 of the second color, and a plurality of third filter units 121*c* each include one transparent pattern 1214 and one filter pattern 1213 of the third color.

In some embodiments, as shown in FIG. 6, the first filter unit 121*a* includes one filter pattern 1211 of the first color, the second filter unit 121*b* includes one transparent pattern 1214 and one filter pattern 1212 of the second color that are stacked in the direction Y that is in the thickness direction of the substrate 110 and away from the substrate 110, and the third filter unit 121*c* includes one transparent pattern 1214 and one filter pattern 1213 of the third color that are stacked in the direction Y that is in the thickness direction of the substrate 110 and away from the substrate 110. In an example in which the first color is red, the second color is blue and the third color is green, the first filter unit 121*a* includes one red filter pattern, that is, the first filter unit 121*a* is a red filter unit; the second filter unit 121*b* includes one transparent pattern and one blue filter pattern that are stacked in the direction Y that is in the thickness direction of the substrate 110 and away from the substrate 110, that is, the second filter 121*b* is a blue filter unit; and the third filter unit 121*c* includes one transparent pattern and one green filter pattern that are stacked in the direction Y that is in the thickness direction of the substrate 110 and away from the substrate 110, that is, the third filter unit 121*c* is a green filter unit.

On this basis, as shown in FIG. 6, the color filter layer 120 includes a first filter layer and a second filter layer that are stacked in the direction Y that is in the thickness direction of the substrate 110 and away from the substrate 110. The first filter layer includes transparent patterns 1214 included by the second filter unit 121*b* and the third filter unit 121*c*, and filter patterns 1211 of the first color included by the first filter unit 121*a* and the light-shielding unit 122. The second filter layer includes filter patterns 1212 of the second color included by the light-shielding unit 122 and the second filter unit 121*b*, and the filter pattern 1213 of the third color included by the third filter unit 121*c*, that is, the second filter layer includes the filter patterns of two colors.

For example, as shown in FIG. 6, a thickness of the filter pattern 1211 of the first color included by the first filter unit 121*a* is h1, i.e., the thickness H of the first filter unit 121*a*; the thickness of the filter pattern 1211 of the first color included by the light-shielding unit 122 is d1, and the thickness h1 of the filter pattern 1211 of the first color included by the first filter unit 121*a* is greater than the thickness d1 of the filter pattern 1211 of the first color included by the light-shielding unit 122, i.e., h1>d1. In this way, a half-depth mask process may be used to simultaneously form the filter patterns 1211 of the first color included by the first filter unit 121*a* and the light-shielding unit 122, and the transparent patterns 1214 included by the second filter unit 121*b* and the third filter unit 121*c*, thereby simplifying a manufacturing process.

For example, a thickness of the transparent pattern 1214 included by the second filter unit 121*b* and a thickness of the transparent pattern 1214 included by the third filter unit 121*c* are both approximately equal to the thickness of the filter pattern 1211 of the first color included by the light-shielding unit 122. Through the above design, a region, not correspond to the first filter unit 121*a*, of a surface of the first filter layer away from the substrate 110 is relatively flat, thereby further improving flatness of a surface, away from the substrate 110, of the second filter layer formed thereon.

In some embodiments, the filter pattern 1211 of the first color included by the light-shielding unit 122, the filter pattern 1211 of the first color included by the first filter unit 121*a*, the transparent pattern 1214 included by the second filter unit 121*b* and the transparent pattern 1214 included by the third filter unit 121*c* are integrally provided. Thus, when the first filter layer of the color filter layer is formed, an accuracy of an opening of a mask may be reduced, thereby facilitating manufacturing of the color filter layer.

In some embodiments, the filter pattern 1212 of the second color included by the light-shielding unit 122 and a filter pattern 1212 of the second color included by a second filter unit 121b adjacent to the light-shielding unit 122 are integrally provided. Thus, when the second filter layer of the color filter layer is formed, the accuracy of an opening of a mask may be reduced, thereby facilitating the manufacturing of the color filter layer.

In some other embodiments, as shown in FIG. 7, the plurality of filter units 121 each include one filter pattern and one transparent pattern 1214 that are stacked, and the transparent pattern 1214 is closer to the substrate 110 than the filter pattern. Transparent patterns 1214 included by the plurality of filter units 121 are all proximate to a side of the substrate 110, and thus the transparent patterns 1214 in the plurality of filter units 121 may be manufactured simultaneously, thereby simplifying the manufacturing process.

For example, the plurality of filter units 121 include first filter units 121a, second filter units 121b and third filter units 121c that are different in color. The first filter unit 121a includes one transparent pattern 1214 and one filter pattern 1211 of the first color, the second filter unit 121b includes one transparent pattern 1214 and one filter pattern 1212 of the second color, and the third filter unit 121c includes one transparent pattern 1214 and one filter pattern 1213 of the third color.

For example, thicknesses of filter patterns included by the plurality of filter units 121 are all h1, thicknesses of the transparent patterns 1214 included by the plurality of filter units 121 are all h2, and thicknesses H of the filter units 121 are all a sum of h1 and h2 (H=h1+h2). The thicknesses h2 of the transparent patterns 1214 included by the plurality of filter units 121 are all approximately equal to the thickness d1 of the filter pattern 1211 of the first color included by the light-shielding unit 122.

On this basis, as shown in FIG. 7, the color filter layer 120 includes a first filter layer and a second filter layer that are stacked in the direction Y that is in the thickness direction of the substrate 110 and away from the substrate 110. The first filter layer includes transparent patterns 1214 included by the first filter unit 121a, the second filter unit 121b and the third filter unit 121c, and filter patterns 1211 of the first color included by the light-shielding unit 122. The second filter layer includes the filter pattern 1211 of the first color included by the first filter unit 121a, filter patterns 1212 of the second color included by the light-shielding unit 122 and the second filter unit 121b, and the filter pattern 1213 of the third color included by the third filter unit 121c. That is, the second filter layer includes the filter patterns of three colors.

For example, the filter pattern 1212 of the second color included by the light-shielding unit 122 and a filter pattern 1212 of the second color included by a second filter unit 121b adjacent to the light-shielding unit 122 are integrally provided. Thus, when the second filter layer of the color filter layer is formed, the accuracy of an opening of a mask may be reduced, thereby facilitating the manufacturing of the color filter layer.

Figure 11:
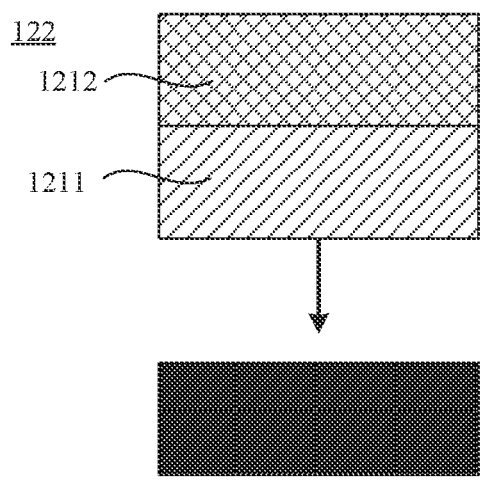
FIG. 11 is a structural diagram of a red filter pattern and a blue filter pattern that are stacked in place of a black matrix, in accordance with some embodiments.

In some embodiments, as shown in FIG. 11, the filter pattern 1211 of the first color is a red filter pattern, and the filter pattern 1212 of the second color is a blue filter pattern; alternatively, the filter pattern 1211 of the first color is a blue filter pattern, and the filter pattern 1212 of the second color is a red filter pattern. That is, the light-shielding unit 122 includes a red filter pattern and a blue filter pattern that are stacked.

Figure 12:
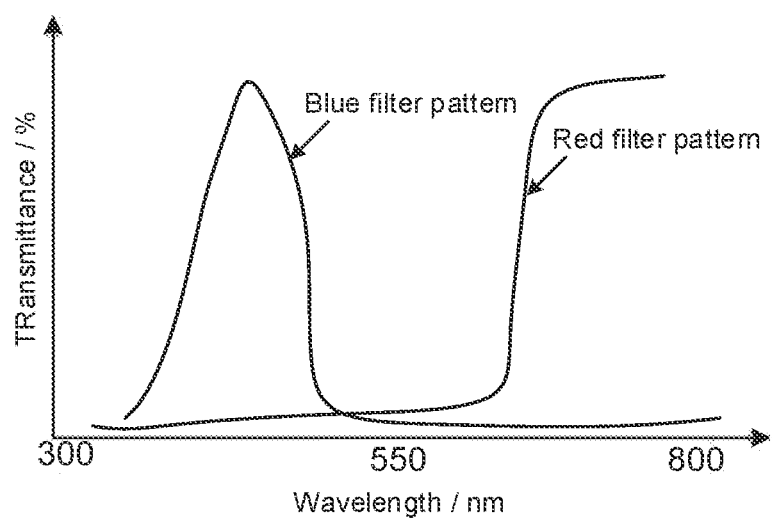
FIG. 12 is a schematic diagram of transmittance spectra of a red filter pattern and a blue filter pattern that are stacked, in accordance with some embodiments.

It will be noted that FIG. 12 is a schematic diagram of transmittance spectra of the red filter pattern and the blue filter pattern that are stacked. Referring to FIG. 12, it will be seen that since a superposition of the red filter pattern and the blue filter pattern has a very low transmittance in a range from 400 nm to 800 nm, which is functionally equivalent to the black matrix (BM). Therefore, the red filter pattern and the blue filter pattern that are stacked is used to replace the black matrix, thereby enabling the light-shielding units 122 and the filter units 121 to be manufactured simultaneously, omitting the process of independently manufacturing the black matrix, and further simplifying the process of manufacturing the display substrate 16.

In some embodiments, a material of the filter pattern 1211 of the first color and a material of the transparent pattern 1214 are each a photochromic material. The photochromic material is in a transparent and colorless state in a case of not being irradiated by set light (ultraviolet light (UV light)), and is in the first color after being irradiated by UV light.

Herein, the photochromic material includes a photochromic compound, a photosensitizer and a resin.

The photochromic compound is a compound that changes from being transparent to being colored by undergoing a photochemical reaction under conditions of UV light. In a case where the filter pattern 1211 of the first color is a red filter pattern, a material of the red filter pattern changes from being transparent to being red by undergoing the photochemical reaction under conditions of UV light; in a case where the filter pattern 1211 of the first color is a blue filter pattern, a material of the blue filter pattern changes from being transparent to being blue by undergoing the photochemical reaction under conditions of UV light.

The photochromic compound is not limited in the present disclosure. The photochromic compound of the red filter pattern may be a naphtho-pyran compound, a phenanthro-pyran compound (after UV irradiation, strong absorption occurs in a range from 450 nm to 550 nm, and resultantly, it shows red), a spironaphtho-pyran compound (after UV irradiation, a ring opening occurs and strong absorption appears in a range from 400 nm to 550 nm, and it shows red), a spirooxazine compound, an ethylenediamine polymolybdate compound, a dithienyl olefin compound, etc.

The photochromic compound of the blue filter pattern may be an organic compound and/or an inorganic compound. The organic compound may be, for example, a spiropyrane compound (under the stimulation of light, chemical bonds in the molecules thereof undergo heterolytic cleavage, and strong absorption occurs in a range from 500 nm to 600 nm, and resultantly, it shows blue), a diarylethene compound (under the irradiation of UV light, it changes from an open-loop state to a closed-loop state to realize blue), a vinylthiophene compound, etc. The inorganic compound may be, for example, a molybdenum trioxide-titanium dioxide ($MoO_3$—$TiO_2$) color-changing system compound, a molybdenum phosphate-silicon dioxide color-changing system, a phosphotungstic acid (PWA) or phosphomolybdic acid (PMoA) color-changing system, a tungstosilicic acid color-changing system, etc.

It will be noted that in some embodiments of the present disclosure, since the photochromic compound material can be chemically reacted to be changed into a corresponding color only by being irradiated by UV light, a place that does not need light irradiation is covered by the mask during the mask exposure. Therefore, photosensitizers provided in some embodiments of the present disclosure are all positive photosensitizers.

Herein, a material of the positive photosensitizer is not limited. The positive photosensitizer is a photo-acid generator, which may be, for example, tart-butylphenyliodonium perfluorooctanesulfonate (TBI-PFOS), triphenylsulfoniumperfluorobutanesulfonate (TPS-PFBS), etc.

In addition, the resin may be, for example, polyethylene terephthalate (PET) or polyimide (PI).

Figure 13:
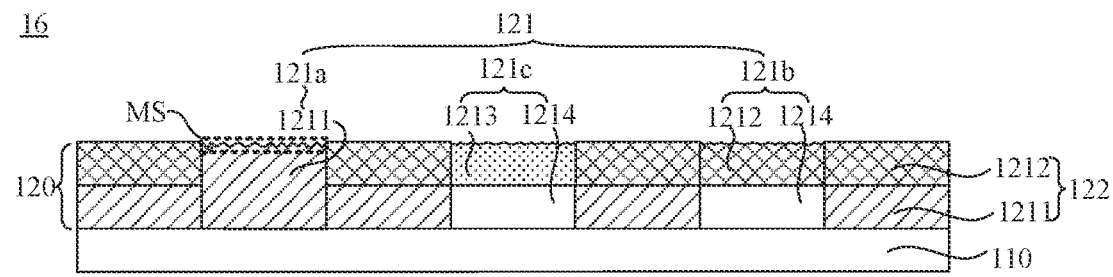
FIG. 13 is a sectional diagram of yet another display substrate, in accordance with some embodiments.

In some embodiments, as shown in FIG. 13, the surface of the filter unit 121 away from the substrate 110 has a microstructure MS, which can make the surface of the filter unit 121 away from the substrate 110 rough. In some embodiments, the microstructure includes a plurality of protrusions and/or depressions, and an order of magnitude of a dimension of the protrusions and/or depressions in the thickness direction of the substrate 110 is, for example, micrometer (μm) or nanometer (nm).

In some embodiments of the present disclosure, when light emitted from the light-emitting layer passes through the surface of the filter unit 121 away from the substrate 110 (i.e., a light-exit surface), since a surface of the light-exit surface has the microstructure, that is, the light-exit surface is relatively rough, the light emitted from the light-emitting layer has different exit angles on the light-exit surface, thereby increasing light-exit viewing angles. In addition, the rough light-exit surface can diffusely reflect external incident light, thereby reducing a specular reflection intensity.

Figure 14:
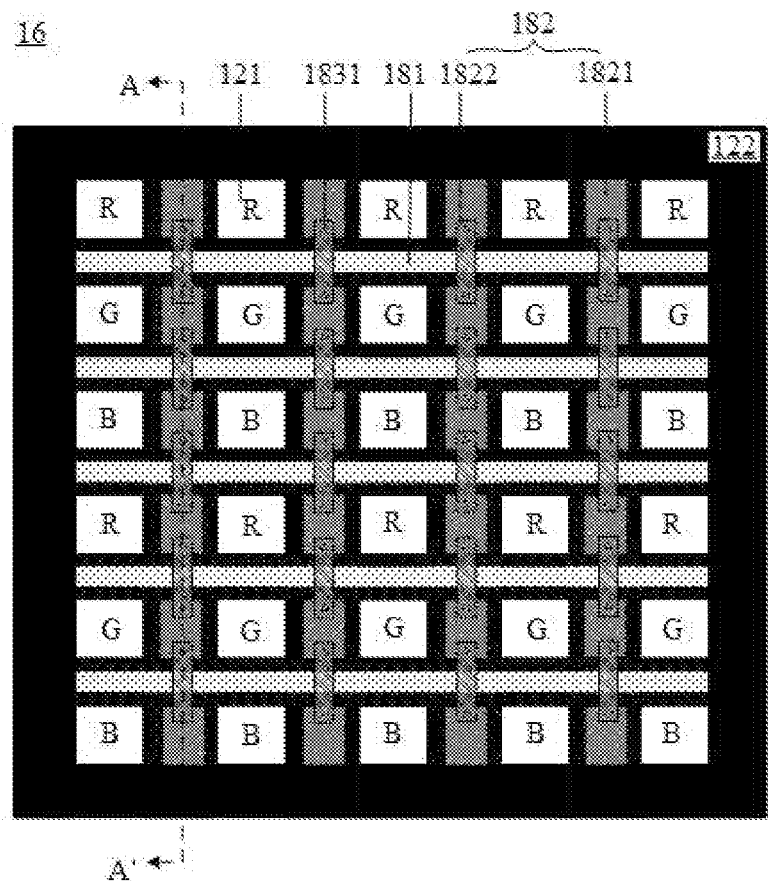
FIG. 14 is a top view of a display substrate, in accordance with some embodiments.
Figure 15:
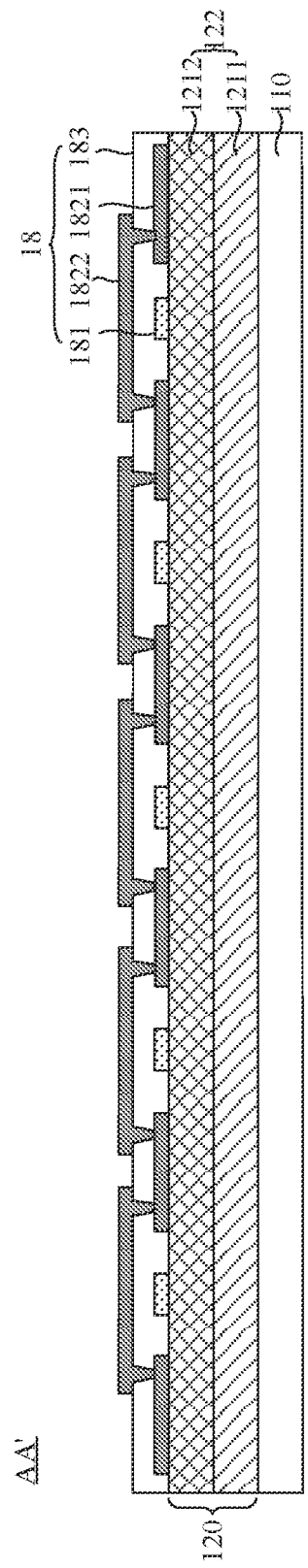
FIG. 15 is a section along the AA' line in FIG. 14.

FIG. 15 is a section along the AA' line in FIG. 14. As shown in FIGS. 14 and 15, the display substrate 16 further includes a touch layer 18 disposed on a side of the color filter layer 120 away from the substrate 110. The touch layer 18 includes a plurality of first touch electrodes 181 and a plurality of second touch electrodes 182 that are arranged crosswise. Orthographic projections of the plurality of first touch electrodes 181 and the plurality of second touch electrodes 182 on the substrate 110 are within orthographic projections of the light-shielding units 122 on the substrate 110.

The first touch electrode 181 includes a plurality of first sub-electrodes connected in series. The second touch electrode 182 includes a plurality of second sub-electrodes 1821 and connection portions 1822, and the connection portion 1822 is used to connect two adjacent second sub-electrodes 1821.

It will be noted that the first touch electrode 181 and the second touch electrode 182 each is a metal grid. The first touch electrode 181 may be a touch transmit electrode (Tx), and the second touch electrode 182 may be a touch receive electrode (Rx), which is not limited in the present disclosure.

It will be understood that the touch layer 18 further includes an insulating layer 183 disposed between the connection portions 1822 and a whole of the first touch electrodes 181 and the second sub-electrodes 1821. The insulating layer 183 has via holes 1831 therein, and the connection portions 1822 and the second sub-electrodes 1821 are connected through the via holes 1831 in the insulating layer 183. On this basis, it is possible that the first touch electrodes 181 and the second sub-electrodes 1821 are disposed closer to the substrate 110 than the connection portions 1822; alternatively, it is possible that the first touch electrodes 181 and the second sub-electrodes 1821 are disposed farther away from the substrate 110 than the connection portions 1822. FIG. 15 is illustrated by taking an example in which the first touch electrodes 181 and the second sub-electrodes 1821 are disposed closer to the substrate 110 than the connection portions 1822.

In the above embodiments, the display substrate 16 further includes the touch layer 18 disposed on the side of the color filter layer 120 away from the substrate 110, and orthographic projections of the first touch electrodes 181 and the second touch electrodes 182 that are included by the touch layer 18 on the substrate 110 are within a range of the orthographic projections of the light-shielding units 122 of the color filter layer 120 on the substrate 110. Therefore, the display apparatus not only may achieve a touch function, but also does not affect a display effect.

Some embodiments of the present disclosure provide a manufacturing method of a display substrate, which is used to manufacture the display substrate 16 mentioned above. The manufacturing method of the display substrate 16 includes:

S10, forming the color filter layer 120 on the substrate 110, the color filter layer 120 including the plurality of filter units 121 arranged in the array and the light-shielding unit 122 disposed between every two adjacent filter units 121, the light-shielding unit 122 including the filter pattern 1211 of the first color and the filter pattern 1212 of the second color that are stacked in the thickness direction of the substrate 110, and the filter pattern 1211 of the first color being closer to the substrate 110 than the filter pattern 1212 of the second color.

The manufacturing method of the display substrate 16 provided in embodiments of the present disclosure has the same beneficial effects as the display substrate 16 provided in the above embodiments. For the beneficial effects, reference can be made to the above embodiments and details will not be described herein.

Figure 16:
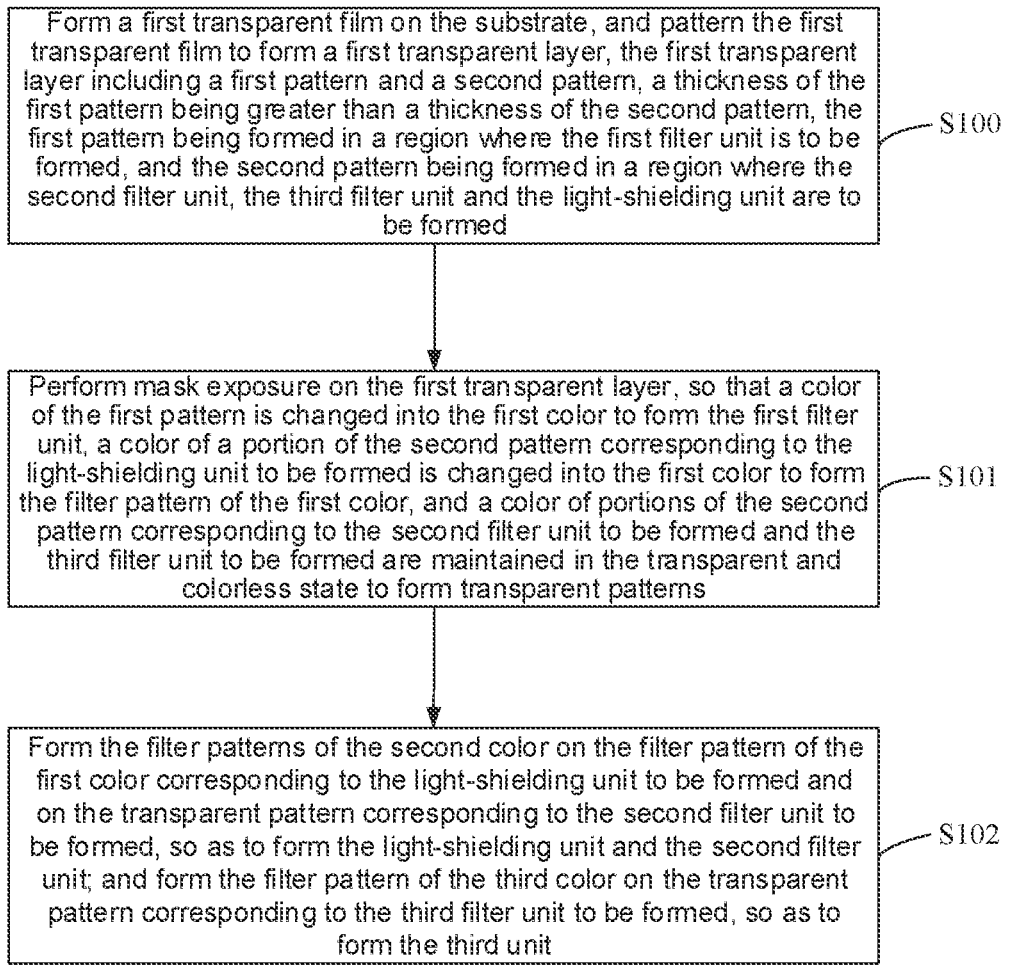
FIG. 16 is a flow diagram of a manufacturing method of forming a color filter layer, in accordance with some embodiments.
Figure 17:
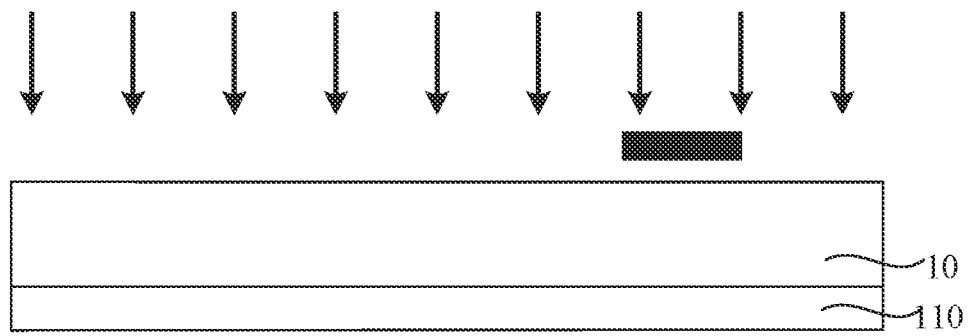
FIGS. 17 to 20 are diagrams showing steps of a manufacturing method of forming a color filter layer, in accordance with some embodiments.
Figure 18:
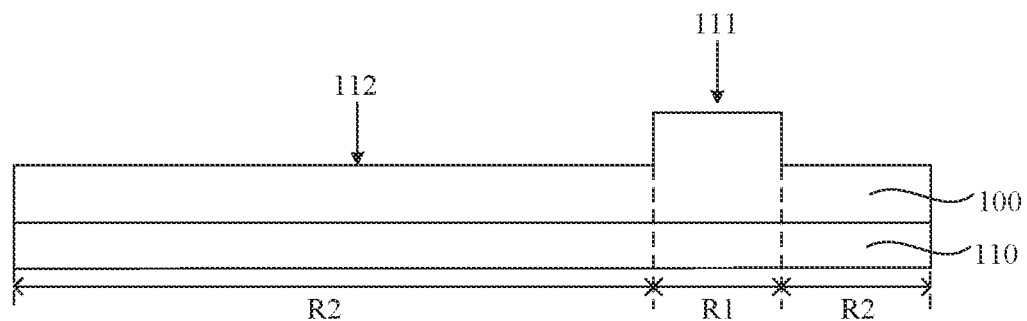
Figure 20:
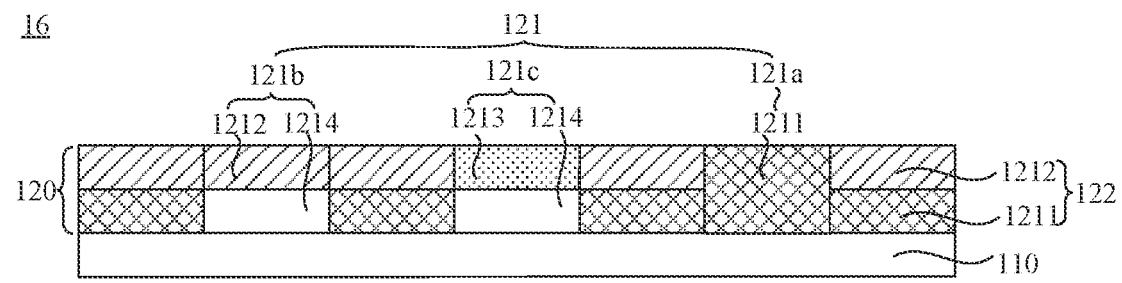

In some embodiments, the plurality of filter units 121 include the first filter units 121a, the second filter units 121b and the third filter units 121c that are different in color. In this case, as shown in FIG. 16, forming the color filter layer 120 on the substrate 110 includes:

S100, as shown in FIGS. 17 and 18, forming a first transparent film 10 on the substrate 110 and patterning the first transparent film 10 to form a first transparent layer 100, the first transparent layer 100 including a first pattern 111 and a second pattern 112, a thickness of the first pattern 111 being greater than a thickness of the second pattern 112, the first pattern 111 being formed in a region R1 where the first filter unit 121a is to be formed, and the second pattern 112 being formed in a region R2 where the second filter unit 121b the third filter unit 121c and the light-shielding unit 122 are to be formed;

S101, as shown in Fla 19, performing mask exposure on the first transparent layer 100, so that a color of the first pattern 111 is changed into the first color to form the first filter unit 121a, a color of a portion of the second pattern 112 corresponding to the light-shielding unit 122 to be formed is changed into the first color to form the filter pattern 1211 of the first color, and a color of portions of the second pattern 112 corresponding to the second filter unit 121b to be formed and the third filter unit 121c to be formed are maintained in the transparent and colorless state to form transparent patterns 1214; and S102, as shown in FIG. 20, forming the filter patterns 1212 of the second color on the filter pattern 1211 of the first color corresponding to the light-shielding unit 122 to be formed and on the transparent pattern 1214 corresponding to the second filter unit 121*b* to be formed, so as to form the light-shielding unit 122 and the second filter unit 121*b*; and forming the filter pattern 1213 of the third color on the transparent pattern 1214 corresponding to the third filter unit 121*c* to be formed, so as to form the third unit 121*c*.

The colors of the first filter unit, the second filter unit and the third filter unit are not limited. For example, the first filter nit is a red filter unit, the second filter unit is a blue filter unit and the third filter unit is a green filter unit.

The light-shielding unit 122 includes the filter pattern 1211 of the first color and the filter pattern 1212 of the second color that are stacked in the thickness direction of the substrate 110, the filter pattern 1211 of the first color is closer to the substrate 110 than the filter pattern 1212 of the second color. In some embodiments, the light-shielding unit 122 includes a red filter pattern and a blue filter pattern that are stacked in the thickness direction of the substrate 110.

In a case where the blue filter pattern is closer to the substrate 110 than the red filter pattern, a manufacturing process of the display substrate 16 is described by taking an example in which the first color is blue, the second color is red, the third color is green and the first transparent film 10 is made of a material having a photochromic blue effect (i.e., a material of the blue filter pattern including a photochromic compound, a photosensitizer and a resin).

As shown in FIG. 17, the substrate 110 is coated with a layer of first transparent film 10, and mask exposure is performed on the first transparent film 10 to form the first transparent layer 100 as shown in FIG. 18. Herein, the first transparent film 10 is subjected to a patterning process to form the first transparent layer 100, the patterning process is also referred to as a half-depth mask process.

It will be noted that since a transmittance change of the material of the first transparent film 10 in a range from 550 nm to 750 nm is less than 0.5%, in a case where the thickness of the first pattern 111 is greater than the thickness of the second pattern 112, transmittance changes of the first pattern 111 and the second pattern 112 in the first transparent layer 100 are approximately the same, so that the display effect will not be affected.

Figure 19:
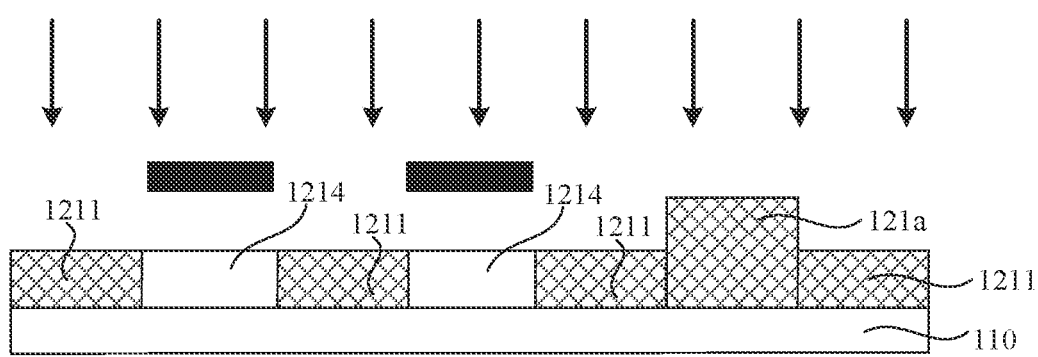

As shown in FIG. 19, the mask exposure is performed on the first transparent layer 100, so as to form the filter pattern 1211 of blue, proximate to the substrate 110, in the light-shielding unit 122 to be formed and form the blue filter unit (i.e., the first filter unit 121*a*), whereas unexposed portions of the first transparent layer 100 form transparent patterns 1214, proximate to the substrate 110, of the red filter unit (i.e., the second filter unit) to be formed and the green filter unit (i.e., the third filter unit) to be formed.

As shown in FIG. 20, red filter patterns are formed on the blue filter pattern corresponding to the light-shielding unit 122 to be formed and on the transparent pattern 1214 corresponding to the red filter unit to be formed, and a green filter pattern is formed on the transparent pattern 1214 corresponding to the green filter unit to be formed.

It will be noted that a method of forming the red filter patterns in a region corresponding to the light-shielding unit 122 to be formed and a region corresponding to the red filter unit to be formed may include the following two types.

In a first type, the region corresponding to the light-shielding unit 122 to be formed and the region corresponding to the red filter unit to be formed are coated with a material having a photochromic red effect to form a film, and the mask exposure is performed on the film, so as to form the red filter patterns.

In a second type, the region corresponding to the light-shielding unit 122 to be formed and the region corresponding to the red filter unit to be formed are coated with a red resin material, so as to form the red filter patterns.

In addition, a region corresponding to the green filter unit to be formed is coated with a green resin material, so as to form the green filter pattern.

In a case where the red filter pattern is closer to the substrate 110 than the blue filter pattern, the manufacturing process of the display substrate 16 is described by taking an example in which the first color is red, the second color is blue, the third color is green and the material of the first transparent film is a material having a photochromic red effect (i.e., the material of the red filter pattern including a photochromic compound, photosensitizer and a resin).

Figure 21:
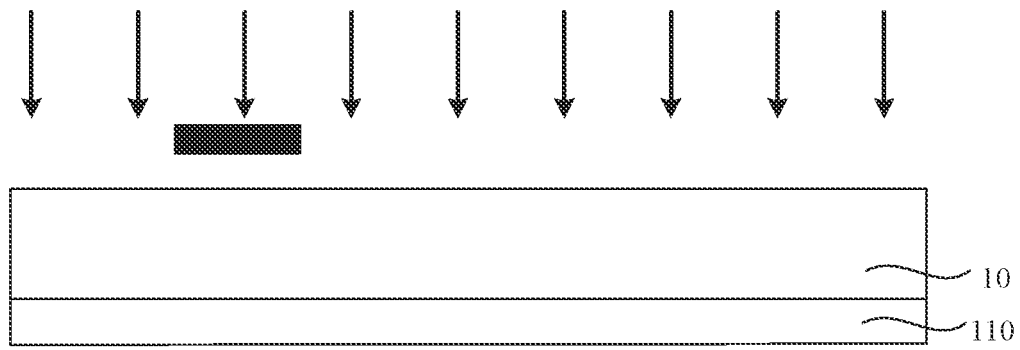
FIGS. 21 to 24 are diagrams showing steps of another manufacturing method of forming a color filter layer, in accordance with some embodiments.
Figure 22:
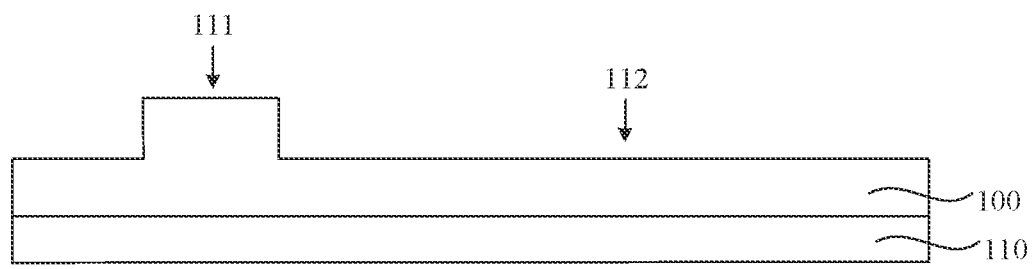

As shown in FIG. 21, the substrate 110 is coated with a layer of first transparent film 10, and mask exposure is performed on the first transparent film 10 to form a first transparent layer 100 as shown in FIG. 22.

Figure 23:
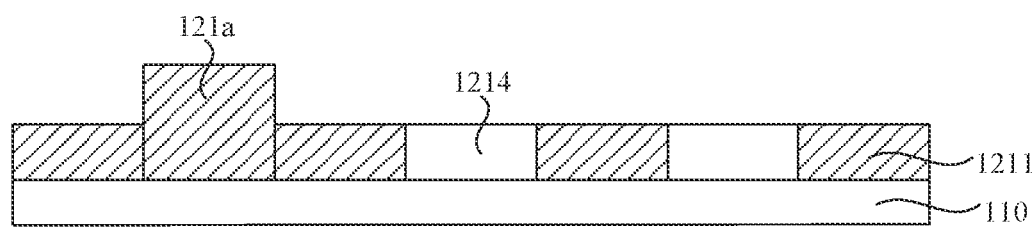

As shown in FIG. 23, the mask exposure is performed on the first transparent layer 100, so as to form the filter pattern 1211 of red, proximate to the substrate 110, in the light-shielding unit 122 to be formed and form the red filter unit (i.e., the first filter unit 121*a*), whereas unexposed portions of the first transparent layer 100 form transparent patterns 1214, proximate to the substrate 110, of the blue filter unit (i.e., the second filter unit) to be formed and the green filter unit (i.e., the third filter unit) to be formed.

Figure 24:
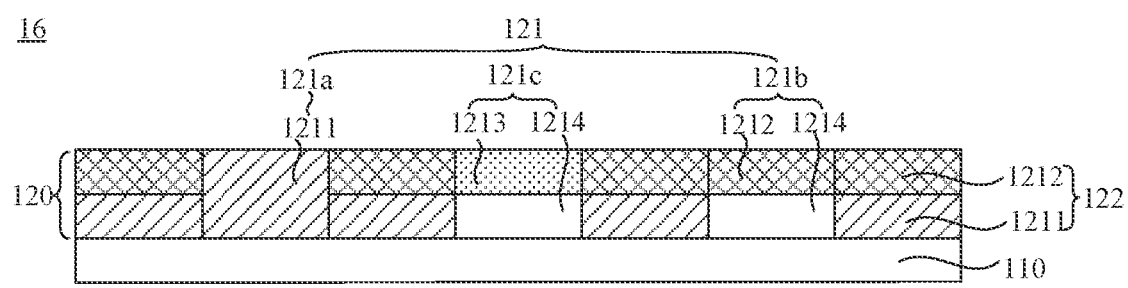

As shown in FIG. 24, blue filter patterns are formed on the red filter pattern corresponding to the light-shielding unit 122 to be formed and on the transparent pattern 1214 corresponding to the blue filter unit to be formed, and a green filter pattern is formed on the transparent pattern 1214 corresponding to the green filter unit to be formed.

Herein, a method of forming the blue filter patterns is the same as the method of forming the red color filter patterns. For the method, reference can be made to the above embodiments and details will not be described herein.

Figure 25:
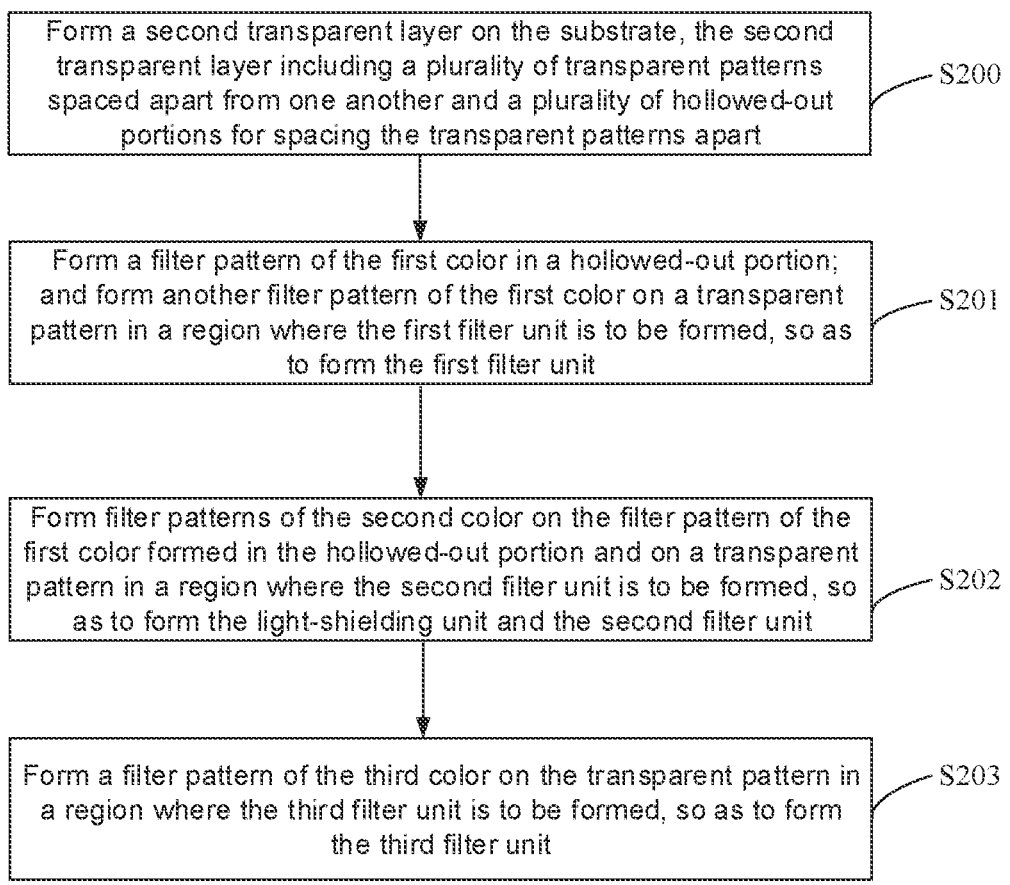
FIG. 25 is a flow diagram of another manufacturing method of forming a color filter layer, in accordance with some embodiments.

In some other embodiments, a material of manufacturing the color filter layer 120 is a material not having a photochromic effect. The plurality of filter units 121 include first filter units 121*a*, second filter units 121*b* and third filter units 121*c* that are different in color. As shown in FIG. 25, forming the color filter layer 120 on the substrate 110 includes S200 to S203.

Figure 27:
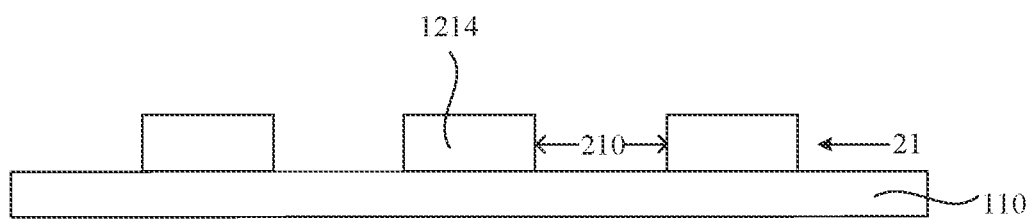

In S200, as shown in FIG. 27, a second transparent layer 21 is formed on the substrate 110, and the second transparent layer 21 includes a plurality of transparent patterns 1214 spaced apart from one another and a plurality of hollowed-out portions 210 for spacing the transparent patterns 1214 apart.

Herein, a material of the second transparent layer 21 is not limited, and the material of the second transparent layer 21 may be, for example, a transparent photoresist.

Figure 28:
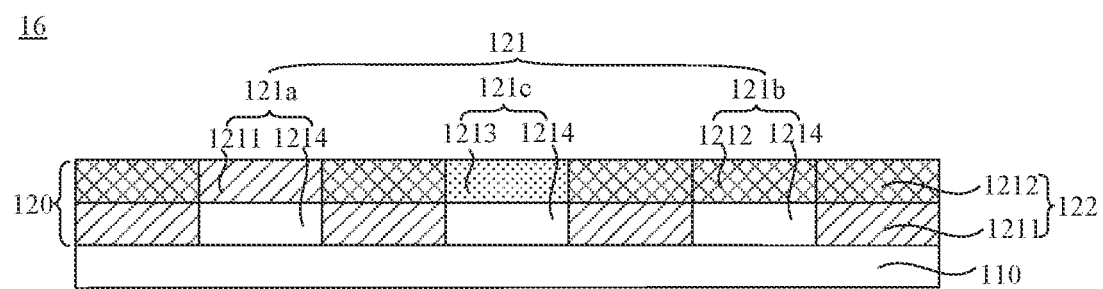

In S201, as shown in FIG. 28, a filter pattern 1211 of the first color is formed in a hollowed-out portion; and another filter pattern 1211 of the first color is formed on a transparent pattern 1214 in a region where the first filter unit 121*a* is to be formed, so as to form the first filter unit 121*a*.

In S202, as shown in FIG. 28, filter patterns 1212 of the second color are formed on the filter pattern 1211 of the first color formed in the hollowed-out portion and on a transparent pattern 1214 in a region where the second filter unit 121*b* is to be formed, so as to form the light-shielding unit 122 and the second filter unit 121*b*.

In S203, as shown in FIG. 28, a filter pattern 1213 of the third color is formed on the transparent pattern 1214 in a region where the third filter unit 121c is to be formed, so as to form the third filter unit 121c.

It will be understood that the first filter unit 121a is a red filter unit, the second filter unit 121b is a blue filter unit, and the third filter unit 121c is a green filter unit; and the light-shielding unit 122 includes a red filter pattern and a blue filter pattern that are stacked.

For example, an embodiment is provided as follows by taking an example in which the red filter pattern is closer to the substrate 110 than the blue filter pattern.

Figure 26:
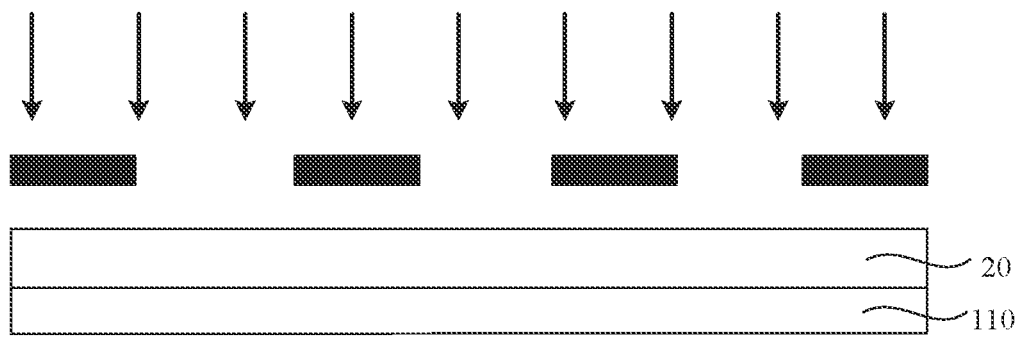
FIGS. 26 to 28 are diagrams showing steps of yet another manufacturing method of forming a color filter layer, in accordance with some embodiments.

As shown in FIG. 26, a second transparent film 20 is formed on the substrate 110, and mask exposure and development are performed on the second transparent film 20 to form the second transparent layer 21 as shown in FIG. 27. As shown in FIG. 28, red filter patterns are formed at positions of the hollowed-out portion and the red filter unit, and then blue filter patterns are formed on the red filter pattern formed in the hollowed-out portion and on the transparent pattern 1214 of the blue filter unit to be formed to form the light-shielding unit 122 and the blue filter unit, and finally the green filter pattern is formed on the transparent pattern 1214 of the green filter unit to be formed to form the green filter unit.

It will be noted that, in the case where the blue filter pattern is closer to the substrate 110 than the red filter pattern, a method of manufacturing the color filter layer 120 is the same as the method in the above embodiments, which will not be described in detail herein.

In some embodiments, the manufacturing method of the display substrate 16 further includes:

S30, forming the touch layer 18 on the color filter layer 120. the touch layer 18 including the plurality of first touch electrodes 181 and the plurality of second touch electrodes 182 that are arranged crosswise; the orthographic projections of the first touch electrodes 181 and the second touch electrodes 182 on the substrate 110 are within the orthographic projection of the light-shielding units 122 of the color filter layer 120 on the substrate 110.

In some embodiments of the present disclosure, a manufacturing method of forming the touch layer 18 has the same technical features and beneficial effects as the touch layer 18 in the above embodiments. For the technical features and beneficial effects, reference can be made to the above embodiments and details will not be described herein.

Figure 29:
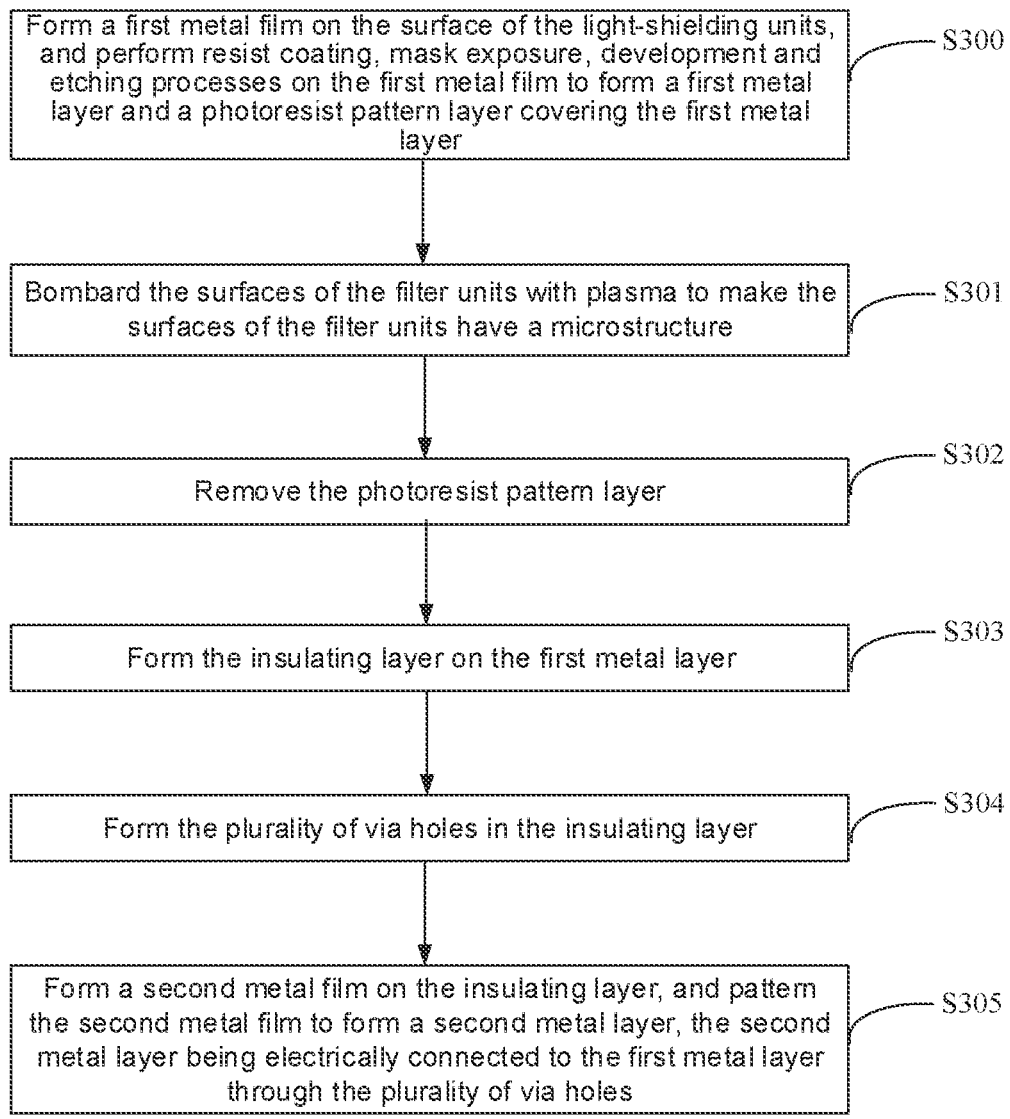
FIG. 29 is a flow diagram of a manufacturing method of forming a touch layer on a color filter layer, in accordance with some embodiments.

As shown in FIG. 29, forming the touch layer 18 on the color filter layer 120 includes S300 to S305.

In S300, a first metal film is formed on the surface of the light-shielding units 122, and resist coating, mask exposure, development and etching processes are performed on the first metal film to form a first metal layer and a photoresist pattern layer covering the first metal layer.

In S301, surfaces of the filter units 121 is bombarded with plasma to make the surfaces of the filter units 121 have a microstructure.

Plasma is a form of matter having free electrons and charged ions as main components. The plasma widely exists in the universe and is generally regarded as a fourth state of matter, which is referred to as a plasma state or "a supergaseous state", and it is also referred to as "a plasma body". In some embodiments of the present disclosure, the surfaces of the filter units 121 may be roughened by bombarding it with a reactive gas such as oxygen ($O_2$) or an inert gas in a vacuum state.

The inert gas may be, for example, argon (Ar), helium (He), neon (Ne), etc.

In S302, the photoresist pattern layer is removed.

In S303, the insulating layer 183 is formed on the first metal layer.

In S304, the plurality of via holes 1831 are formed in the insulating layer 183.

In S305, a second metal film is formed on the insulating layer 183, and the second metal film is patterned to form a second metal layer; and the second metal layer is electrically connected to the first metal layer through the plurality of via holes 1831.

One of the first metal layer and the second metal layer includes a plurality of rows of first sub-electrodes and a plurality of columns of second sub-electrodes, and first sub-electrodes in each row are connected in series to form a first touch electrode 181; the other of the first metal layer and the second metal layer includes the plurality of connection portions 1822, and every two adjacent second sub-electrodes 1821 in each column of second sub-electrodes 1821 are electrically connected to a connection portion 1822 through via holes 1831 to form a second touch electrode 182.

An arrangement of the insulating layer 183 is not limited. The insulating layer 183 may be provided as a whole layer, or may be provided only at positions of the light-shielding units 122.

In the embodiments of the present disclosure, since the superposition of the red filter pattern and the blue filter pattern is used to replace the black matrix, and the red filter pattern and the blue filter pattern may be formed simultaneously with the filter units 121, the process of independently manufacturing the black matrix can be omitted. Moreover, since the thickness of the light-shielding unit 122 and the thickness of the filter unit 121 are equal, a manufacturing of an additional planarization layer can be omitted, thereby simplifying the process of manufacturing the display substrate 16.

On this basis, in a case where the touch layer 18 is disposed on the color filter layer 120, in a process of forming the first metal layer, before the photoresist is removed, the surfaces of the filter units 121 are roughened by using the plasma gas, and then the photoresist is removed. In this way, a surface of the first metal layer is not damaged, and a separate descum process (i.e., a process of roughening the surfaces of the filter units 121) can be omitted, thereby further simplifying the process of manufacturing the display substrate 16.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
    a substrate;
    a color filter layer disposed on the substrate, the color filter layer including a plurality of filter units arranged in an array and a plurality of light-shielding units, every two adjacent filter units being provided with a light-shielding unit of the plurality of light-shielding units therebetween, wherein
    the light-shielding unit includes a filter pattern of a first color and a filter pattern of a second color that are stacked in a thickness direction of the substrate, the filter pattern of the first color is closer to the substrate than the filter pattern of the second color;

a surface of one or more filter units of the plurality of filter units away from the substrate has a microstructure, and the microstructure includes a plurality of protrusions and/or depressions;

at least one filter unit of the plurality of filter units includes another filter pattern and one transparent pattern that are stacked in the thickness direction of the substrate, and in the at least one filter unit, the one transparent pattern is closer to the substrate than the another filter pattern; and a material of the filter pattern of the first color and a material of the one transparent pattern are each a photochromic material, the photochromic material includes a photochromic compound, a photosensitizer and a resin, wherein the photosensitizer is a positive photosensitizer; and a touch layer disposed on a side of the color filter layer away from the substrate, the touch layer including a plurality of first touch electrodes and a plurality of second touch electrodes that are arranged crosswise, orthographic projections of the plurality of first touch electrodes and the plurality of second touch electrodes on the substrate being within a range of orthographic projections of the plurality of light-shielding units on the substrate, wherein the touch layer is in contact with the color filter layer.

2. The display substrate according to claim 1, wherein another at least one filter unit of the plurality of filter units includes yet another filter pattern.

3. The display substrate according to claim 1, wherein the plurality of filter units include first filter units, second filter units and third filter units that are different in color, wherein
a first filter unit includes another filter pattern of the first color;
a second filter unit includes a transparent pattern and another filter pattern of the second color that are stacked in a direction that is in the thickness direction of the substrate and away from the substrate; and
a third filter unit includes another transparent pattern and a filter pattern of a third color that are stacked in the direction that is in the thickness direction of the substrate and away from the substrate.

4. The display substrate according to claim 3, wherein a thickness of the filter pattern of the first color included by the first filter unit is greater than a thickness of the filter pattern of the first color included by the light-shielding unit; and/or
a thickness of the transparent pattern included by the second filter unit and a thickness of the transparent pattern included by the third filter unit are both equal to a thickness of the filter pattern of the first color included by the light-shielding unit.

5. The display substrate according to claim 3, wherein the filter pattern of the first color included by the light-shielding unit, the filter pattern of the first color included by the first filter unit, the transparent pattern included by the second filter unit and the transparent pattern included by the third filter unit are provided as a one-piece structure; and/or
the filter pattern of the second color included by the light-shielding unit and yet another filter pattern of the second color included by a second filter unit adjacent to the light-shielding unit are provided as a one-piece structure.

6. The display substrate according to claim 1, wherein the plurality of filter units each include the another filter pattern and the one transparent pattern that are stacked in the thickness direction of the substrate, and in each filter unit, the one transparent pattern is closer to the substrate than the another filter pattern.

7. The display substrate according to claim 6, wherein the plurality of filter units include first filter units, second filter units and third filter units that are different in color, wherein
another filter pattern included by a first filter unit is another filter pattern of the first color;
another filter pattern included by a second filter unit is another filter pattern of the second color; and
another filter pattern included by a third filter unit is a filter pattern of a third color;
wherein the filter pattern of the second color included by the light-shielding unit and yet another filter pattern of the second color included by a second filter unit adjacent to the light-shielding unit are provided as a one-piece structure.

8. The display substrate according to claim 6, wherein thicknesses of transparent patterns included by the plurality of filter units are all equal to a thickness of the filter pattern of the first color included by the light-shielding unit.

9. The display substrate according to claim 1, wherein the plurality of filter units include first filter units, second filter units and third filter units that are different in color, wherein
a second filter unit includes a transparent pattern and another filter pattern of the second color that are stacked in the thickness direction of the substrate;
a third filter unit includes another transparent pattern and a filter pattern of a third color that are stacked in the thickness direction of the substrate; and
a first filter unit includes another filter pattern of the first color; and
the photochromic material is in a transparent and colorless state in a case of not being irradiated by the set light, and is in the first color after being irradiated by the set light.

10. The display substrate according to claim 1, wherein the filter pattern of the first color is a red filter pattern, and the filter pattern of the second color is a blue filter pattern; or
the filter pattern of the first color is a blue filter pattern, and the filter pattern of the second color is a red filter pattern.

11. The display substrate according to claim 1, wherein a thickness of a filter unit of the plurality of filter units is greater than a thickness of the filter pattern of the first color, and is less than a sum of the thickness of the filter pattern of the first color and twice a thickness of the filter pattern of the second color.

12. The display substrate according to claim 11, wherein the thickness of the filter unit is equal to a thickness of the light-shielding unit; or
a surface of the filter unit away from the substrate is flush with a surface of the light-shielding unit away from the substrate.

13. The display substrate according to claim 1, wherein
a first touch electrode and a second touch electrode are each of a metal grid structure.

14. A display apparatus, comprising the display substrate according to claim 1.

15. A manufacturing method of a display substrate, the manufacturing method comprising:
forming a color filter layer on a substrate, the color filter layer including a plurality of filter units arranged in an array and a plurality of light-shielding units, every two adjacent filter units being provided with a light-shielding unit of the plurality of light-shielding units therebetween, wherein
the light-shielding unit includes a filter pattern of a first color and a filter pattern of a second color that are stacked in a thickness direction of the substrate, and the filter pattern of the first color is closer to the substrate than the filter pattern of the second color;
a surface of one or more filter units of the plurality of filter units away from the substrate has a microstructure, and the microstructure includes a plurality of protrusions and/or depressions;
at least one filter unit of the plurality of filter units includes another filter pattern and one transparent pattern that are stacked in the thickness direction of the substrate, and in the at least one filter unit, the one transparent pattern is closer to the substrate than the another filter pattern; and
a material of the filter pattern of the first color and a material of the one transparent pattern are each a photochromic material, the photochromic material includes a photochromic compound, a photosensitizer and a resin, wherein the photosensitizer is a positive photosensitizer; and
forming a touch layer on the color filter layer, the touch layer including a plurality of first touch electrodes and a plurality of second touch electrodes that are arranged crosswise, orthographic projections of the plurality of first touch electrodes and the plurality of second touch electrodes on the substrate being within orthographic projections of the plurality of light-shielding units on the substrate, wherein the touch layer is in contact with the color filter layer.

16. The manufacturing method according to claim 15, wherein the plurality of filter units include first filter units, second filter units and third filter units that are different in color;
forming the color filter layer on the substrate includes:
forming a first transparent film made of a photochromic material on the substrate, the photochromic material being in a transparent and colorless state in a case of not being irradiated by set light, and being in the first color after being irradiated by the set light;
patterning the first transparent film to form a first transparent layer, the first transparent layer including a first pattern and a second pattern, a thickness of the first pattern being greater than a thickness of the second pattern, the first pattern being formed in a region where a first filter unit is to be formed, and the second pattern being formed in a region where a second filter unit, a third filter unit and the light-shielding unit are to be formed;
performing mask exposure on the first transparent layer by using of the set light, so that a color of the first pattern is changed into the first color to form the first filter unit, a color of a portion of the second pattern corresponding to the light-shielding unit to be formed is changed into the first color to form the filter pattern of the first color, and a color of portions of the second pattern corresponding to the second filter unit to be formed and the third filter unit to be formed are maintained in the transparent and colorless state to form transparent patterns;
forming filter patterns of the second color on the filter pattern of the first color corresponding to the light-shielding unit to be formed and on the transparent pattern corresponding to the second filter unit to be formed, so as to form the light-shielding unit and the second filter unit; and
forming a filter pattern of a third color on the transparent pattern corresponding to the third filter unit to be formed, so as to form the third filter unit; or
forming the color filter layer on the substrate includes:
forming a second transparent layer on the substrate, the second transparent layer including a plurality of transparent patterns and a plurality of hollowed-out portions, every two adjacent transparent patterns being provided with a hollowed-out portion of the plurality of hollowed-out portions therebetween;
forming the filter pattern of the first color in the hollowed-out portion;
forming another filter pattern of the first color on a transparent pattern in a region where a first filter unit is to be formed, so as to form the first filter unit;
forming the filter pattern of the second color on the filter pattern of the first color formed in the hollowed-out portion, so as to form the light-shielding unit;
forming another filter pattern of the second color on a transparent pattern in a region where a second filter unit is to be formed, so as to form the second filter unit; and
forming a filter pattern of a third color on a transparent pattern in a region where the third filter unit is to be formed, so as to form the third filter unit.

17. The manufacturing method according to claim 15, wherein
forming the touch layer on the color filter layer includes:
forming a first metal film on a surface of the plurality of light-shielding units;
performing resist coating, mask exposure, development and etching processes on the first metal film in sequence, so as to form a first metal layer and a photoresist pattern layer covering the first metal layer;
bombarding surfaces, away from the substrate, of the plurality of filter units with plasma to make the surfaces of the plurality of filter units each have a microstructure;
removing the photoresist pattern layer;
forming an insulating layer having a plurality of via holes on the first metal layer;
forming a second metal film on the insulating layer; and
patterning the second metal film to form a second metal layer, the second metal layer being electrically connected to the first metal layer through the plurality of via holes, wherein
one of the first metal layer and the second metal layer includes a plurality of rows of first sub-electrodes and a plurality of columns of second sub-electrodes, first sub-electrodes in each row are connected in series to form a first touch electrode; and another of the first metal layer and the second metal layer includes a plurality of connection portions, every two adjacent second sub-electrodes in each column of second sub-electrodes are electrically connected to a connection portion through via holes to form a second touch electrode.

18. The display substrate according to claim 1, wherein another at least one filter unit of the plurality of filter units includes another two filter patterns of a same color that are stacked in the thickness direction of the substrate.

19. The display substrate according to claim 1, wherein the plurality of filter units include first filter units, second filter units and third filter units that are different in color, wherein
- a second filter unit includes a transparent pattern and another filter pattern of the second color that are stacked in the thickness direction of the substrate;
- a third filter unit includes another transparent pattern and a filter pattern of a third color that are stacked in the thickness direction of the substrate; and
- a first filter unit includes yet another transparent pattern and another filter pattern of the first color that are stacked in the thickness direction of the substrate; and
- the photochromic material is in a transparent and colorless state in a case of not being irradiated by the set light, and is in the first color after being irradiated by the set light.

* * * * *